(12) United States Patent
Lee et al.

(10) Patent No.: US 11,997,906 B2
(45) Date of Patent: May 28, 2024

(54) LIGHT EMITTING DISPLAY DEVICE

(71) Applicant: LG Display Co., Ltd., Seoul (KR)

(72) Inventors: KyungEon Lee, Paju-si (KR); JongSung Kim, Paju-si (KR); Inae Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 408 days.

(21) Appl. No.: 17/549,534

(22) Filed: Dec. 13, 2021

(65) Prior Publication Data

US 2022/0199708 A1    Jun. 23, 2022

(30) Foreign Application Priority Data

Dec. 18, 2020  (KR) .................. 10-2020-0178475
Nov. 16, 2021  (KR) .................. 10-2021-0157288

(51) Int. Cl.
*H10K 59/35*    (2023.01)
*H10K 59/122*   (2023.01)
*H10K 59/38*    (2023.01)

(52) U.S. Cl.
CPC ......... *H10K 59/353* (2023.02); *H10K 59/122* (2023.02); *H10K 59/38* (2023.02)

(58) Field of Classification Search
None
See application file for complete search history.

(56) References Cited

U.S. PATENT DOCUMENTS

| | | | |
|---|---|---|---|
| 2019/0165326 A1* | 5/2019 | Kim | H10K 59/38 |
| 2019/0280063 A1* | 9/2019 | Lee | H10K 71/221 |
| 2020/0144342 A1* | 5/2020 | Shim | H10K 50/81 |
| 2021/0167146 A1* | 6/2021 | Yang | H10K 50/813 |
| 2021/0184157 A1* | 6/2021 | Tan | H10K 50/824 |
| 2021/0327981 A1* | 10/2021 | Lee | H10K 71/221 |
| 2022/0102471 A1* | 3/2022 | Jang | H10K 59/131 |
| 2022/0208913 A1* | 6/2022 | Lee | H10K 50/813 |
| 2022/0384559 A1* | 12/2022 | Zeng | H10K 59/1315 |
| 2023/0165061 A1* | 5/2023 | Huang | H10K 59/873 257/91 |
| 2023/0217680 A1* | 7/2023 | Seong | H10K 59/80515 257/40 |
| 2023/0217721 A1* | 7/2023 | Seong | H10K 59/771 257/40 |

* cited by examiner

*Primary Examiner* — Alexander G Ghyka
(74) *Attorney, Agent, or Firm* — Fenwick & West LLP

(57) ABSTRACT

A light emitting display device comprises a substrate having subpixel areas, a plurality of first electrodes, each of the first electrodes in a corresponding one of the subpixel areas, a bank covering an edge portion of each of the first electrodes, the bank, a disconnection portion disposed at boundary areas between the subpixel areas, an undercut area in the disconnection portion, the undercut area formed under an end of the bank that extends past an end of a first electrode from the plurality of first electrodes, a light emitting element layer including a first portion and a second portion, the first portion disposed on the first electrode, the bank, and electrically connected to the first electrode, and the second portion disposed in the disconnection portion but is not electrically connected to the first electrode, and a second electrode on the light emitting element layer.

28 Claims, 17 Drawing Sheets

LIGHT EMITTING DISPLAY DEVICE

CROSS-REFERENCE TO RELATED APPLICATIONS

This application claims the benefit of the Republic of Korea Patent Application No. 10-2020-0178475 filed on Dec. 18, 2020 and the Republic of Korea Patent Application No. 10-2021-0157288 filed on Nov. 16, 2021, each of which are hereby incorporated by reference in its entirety.

BACKGROUND

Field of Technology

The present disclosure relates to a light emitting display device.

Discussion of the Related Art

With the advancement of the information age, the demand for a display device for displaying an image has increased with various forms.

Among such display devices, a light emitting display device is classified into an inorganic light emitting display device and an organic light emitting display device depending on a material of a light emitting layer. For example, the organic light emitting display device is a self-luminance display device which injects holes from an anode electrode and electrons from a cathode electrode into a light emitting layer and emits light when an exciton generated by combination of the injected holes and electrons falls from an excited state to a ground state.

The organic light emitting display device may be formed in a tandem structure of two stacks or more in which two or more light emitting layers are deposited. At this time, the two or more stacks may be formed as a common layer so that current may be leaked from one pixel to another adjacent pixel. The adjacent pixel has a problem in that a color reproduction rate is deteriorated due to the leakage current.

SUMMARY

The present disclosure has been made in view of the above problems and it is an object of the present disclosure to provide a light emitting display device that may prevent a leakage current from occurring between adjacent pixels.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display device comprising a substrate having a plurality of subpixel areas; a plurality of first electrodes, each of the plurality of first electrodes disposed in a corresponding one of the plurality of subpixel areas; a bank covering an end of each of the plurality of first electrodes, the bank defining an opening of each of the plurality of subpixel areas; a disconnection portion disposed at boundary areas between the plurality of subpixel areas; an undercut area in the disconnection portion, the undercut area formed under an end of the bank that extends past an end of a first electrode from the plurality of first electrodes; a light emitting element layer including a first portion and a second portion, the first portion electrically connected to the first electrode and disposed on the first electrode, the bank, and the disconnection portion, and the second portion disposed in the disconnection portion but is not electrically connected to the first electrode due to the undercut area; and a second electrode disposed on the light emitting element layer.

In accordance with another aspect of the present disclosure, the above and other objects can be accomplished by the provision of a light emitting display device comprising a substrate having a first subpixel area and a second subpixel area, a planarization layer disposed on the first subpixel area and the second subpixel area of the substrate; a first electrode in the first subpixel area, the first electrode on the planarization layer; a first bank disposed on the first electrode; a disconnection portion between the first subpixel area and the second subpixel area, a portion of the planarization layer exposed in the disconnection portion; a light emitting element layer including a first portion and a second portion, the first portion disposed on the first electrode, the first bank, and the disconnection portion, the first portion including a first plurality of light emitting layers and at least one first charge generation layer interposed between the plurality of first light emitting layers that are electrically connected to the first electrode, and the second portion disposed in the disconnection portion and including a second plurality of light emitting layers and at least one second charge generation layer interposed between the plurality of second light emitting layers that are not electrically connected to the first electrode; and a second electrode disposed on the light emitting element layer, wherein the second portion of the light emitting layer is on the exposed portion of the planarization layer that is in the disconnection portion.

According to various embodiments of the present disclosure, a light emitting display device may comprise a substrate having a first subpixel area and a second subpixel area; a first electrode disposed in the first subpixel area and a first electrode disposed in the second subpixel area; a bank covering an end of each of the first electrodes, the bank defining an opening of each of the first subpixel area and the second subpixel area; a disconnection portion disposed at a boundary portion between the first subpixel area and the second subpixel area; an undercut area in the disconnection portion, the undercut area formed under an end of the bank that extends past an end of the first electrode of the first subpixel area, and an outer surface of the first electrode of the second subpixel area covered by the bank; and a light emitting element layer disposed on the first electrode of the first subpixel area, the first electrode of the second subpixel area, the bank, and the disconnection portion, the light emitting element including a first portion that is electrically connected to the first electrode in the first subpixel area, a second portion that is electrically connected to the first electrode in the second subpixel area, and a third portion in the disconnection portion, wherein the third portion of the light emitting layer is not electrically connected to the first electrode in the first pixel area and the first electrode in the second pixel area due to the undercut area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
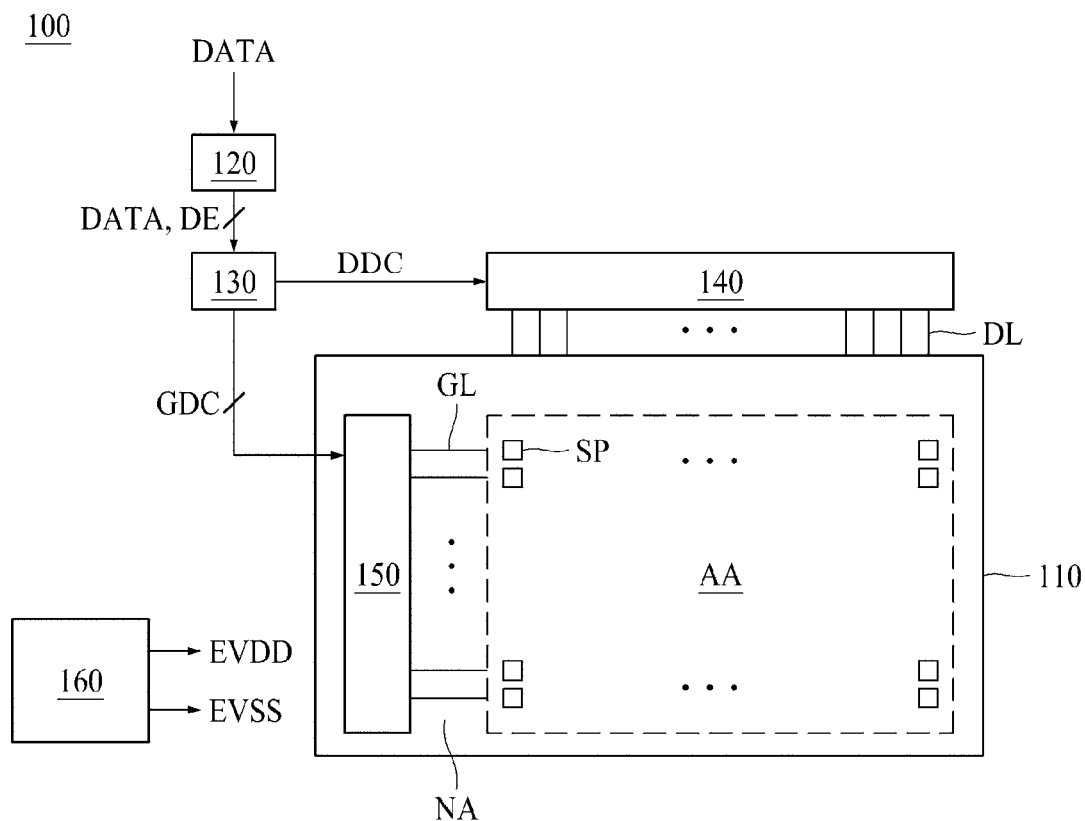
FIG. 1 is a schematic block view illustrating a light emitting display device according to various embodiments of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, a preferred embodiment of a light emitting display device according to the embodiment of the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a schematic block view illustrating a light emitting display device according to various embodiments of the present disclosure.

Referring to FIG. 1, a light emitting display device 100 according to various embodiments of the present disclosure may include a display panel 110, an image processor 120, a timing controller 130, a data driver 140, a scan driver 150, and a power supply 160.

The display panel 110 may display an image in response to a data signal DATA supplied from the data driver 140, a scan signal supplied from the scan driver 150, and a power source supplied from the power supply 160.

The display panel 110 may include subpixels SP disposed for each intersection area between a plurality of gate lines GL and a plurality of data lines DL. Various modifications may be made in a structure of the subpixel SP depending on a type of the display device 100.

For example, the subpixels SP may be formed in a top emission method, a bottom emission method, or a dual emission method in accordance with a structure. The subpixels SP may include a red subpixel, a green subpixel and a blue subpixel, or may include a red subpixel, a blue subpixel, a white subpixel and a green subpixel. The subpixels SP may have one or more different light emission areas in accordance with light emission characteristics.

One or more subpixels SP may constitute one unit pixel. For example, one unit pixel may include red, green and blue subpixels, and the red, green and blue subpixels may repeatedly be disposed. Alternatively, one unit pixel may include red, green, blue, and white subpixels, and the red, green, blue, and white subpixels may repeatedly be disposed, or may be disposed in a quad type. However, without limitation to this example, in various embodiments according to the present disclosure, a color type, an arrangement type, an arrangement order, etc. of the subpixels may be provided in various forms depending on the light emission characteristics, lifespan of an element, spec. of the device, and the like.

The display panel 110 may be categorized into a display area AA on which the subpixels SP are disposed to display an image, and a non-display area NA in the vicinity of the display area AA. The scan driver 150 may be packaged in the non-display area NA of the display panel 110. Also, the non-display area NA may include a pad area.

The image processor 120 may output a data enable signal DE together with the data signal DATA supplied from the outside. The image processor 120 may output one or more of a vertical synchronization signal, a horizontal synchronization signal and a clock signal in addition to the data enable signal DE, but these signals are not shown for convenience of description.

The timing controller 130 may be supplied with the data signal DATA together with a driving signal, which includes the data enable signal DE or the vertical synchronization signal, the horizontal synchronization signal and the clock signal, from the image processor 120. The timing controller 130 may output a data timing control signal DDC for controlling an operation timing of the data driver 140 and a gate timing control signal GDC for controlling an operation timing of the scan driver 150, based on the driving signal.

The data driver 140 may sample and latch the data signal DATA supplied from the timing controller 130 in response to the data timing control signal DDC supplied from the timing controller 130, and may convert the latched data signal into a gamma reference voltage and output the gamma reference voltage.

The data driver 140 may output the data signal DATA through data lines DL1 to DLn. The data driver 140 may be embodied in the form of an integrated circuit (IC). For example, the data driver 140 may electrically be connected with the pad area disposed in the non-display area NA through a flexible circuit film.

The scan driver 150 may output the scan signal in response to the gate timing control signal GDC supplied from the timing controller 130. The scan driver 150 may output the scan signal through gate lines GL1 to GLm. The scan driver 150 may be embodied in the form of an integrated circuit (IC) or may be embodied in the display panel 110 in a gate-in-panel (GIP) type.

The power supply 160 may output a high potential voltage and a low potential voltage for driving the display panel 110. The power supply 160 may supply the high potential voltage to the display panel 110 through a first power line EVDD (or driving power line) and supply the low potential voltage to the display panel 110 through a second power line EVSS (or auxiliary power line).

First Embodiment

Figure 2:
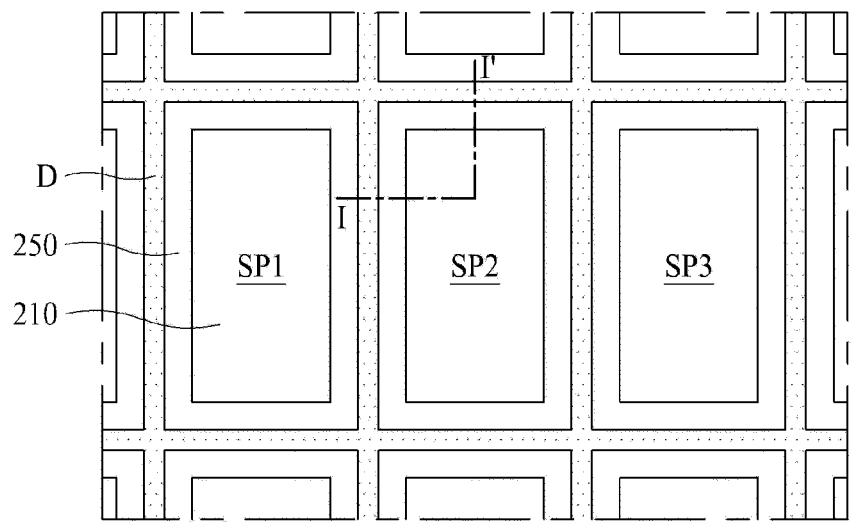
FIG. 2 is a schematic plane view illustrating a first electrode, a bank and a disconnection portion of subpixels in a light emitting display device according to the first embodiment of the present disclosure.
Figure 3:
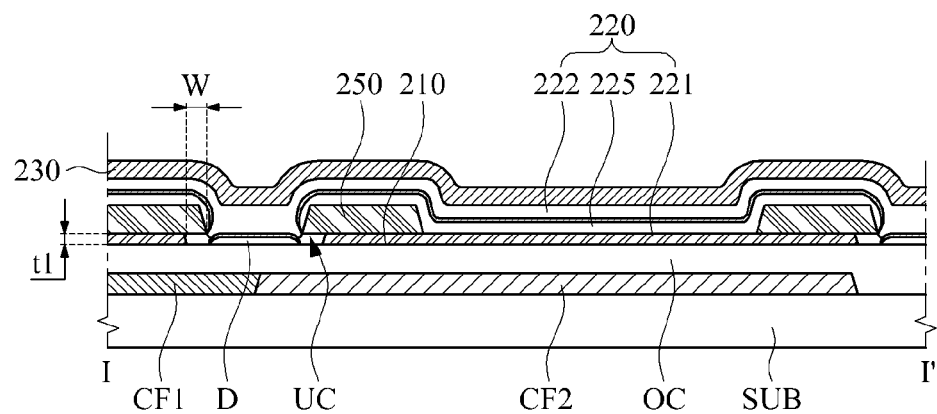
FIG. 3 is a cross-sectional view taken along line I-I' of FIG. 2 according to the first embodiment of the present disclosure.
Figure 4:
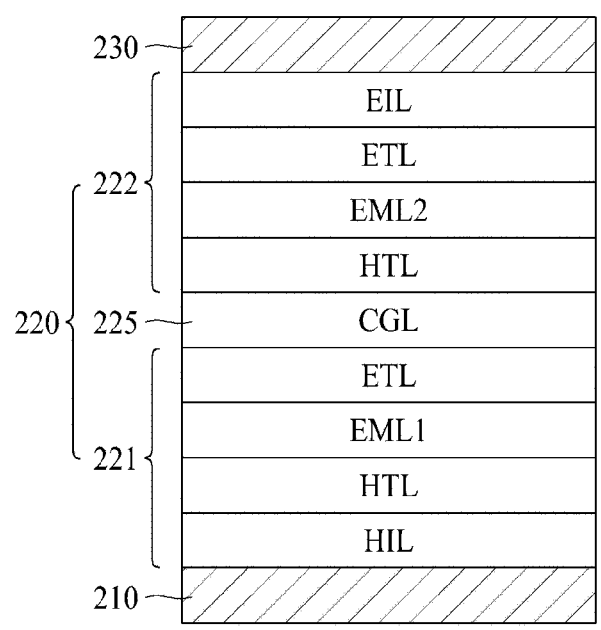
FIG. 4 is a detailed cross-sectional view illustrating an example of a first electrode, a light emitting element layer and a second electrode in a light emitting display device according to various embodiments of the present disclosure.

FIG. 2 is a schematic plane view illustrating a first electrode, a bank and a disconnection portion of subpixels in a light emitting display device according to the first embodiment of the present disclosure. FIG. 3 is a cross-sectional view taken along line I-I' of FIG. 2 according to the first embodiment of the present disclosure. FIG. 4 is a detailed cross-sectional view illustrating an example of a first electrode, a light emitting element layer and a second electrode in a light emitting display device according to various embodiments of the present disclosure.

Referring to FIGS. 2 to 4 in conjunction with FIG. 1, a display panel 110 of a light emitting display device according to the first embodiment of the present disclosure is categorized into a display area AA and a non-display area NA, and may include a first electrode 210, a bank 250, a light emitting element layer 220, a second electrode 230, and a disconnection portion D on the bank 250 on a substrate SUB having a plurality of subpixel areas in the display area AA.

Data lines DL and gate lines GL crossing the data lines DL may be formed in the display area AA of the substrate SUB. The plurality of subpixel areas may be defined in each area where the data lines DL and the gate lines GL cross each other, and a plurality of subpixels SP may be disposed in each of the subpixel areas.

As shown in FIG. 2, the plurality of subpixels SP may include a first subpixel SP1, a second subpixel SP2, and a third subpixel SP3. For example, the first subpixel SP1 may emit blue light, the second subpixel SP2 may emit red light and the third subpixel SP3 may emit green light, but are not limited thereto. The plurality of subpixels SP may further include a fourth subpixel for emitting white (W) light. In addition, the arrangement order of the subpixels SP1, SP2 and SP3 may be changed in various ways.

The first electrode 210 (e.g., anode electrode or pixel electrode) may be disposed in each of the plurality of subpixels SP1, SP2 and SP3. The bank 250 may be disposed on the first electrode 210 to cover an edge portion of each of the first electrodes 210 and define an opening corresponding to the plurality of subpixels SP1, SP2 and SP3. The bank 250 may be formed of an inorganic film, for example, a silicon oxide film (SiOx), a silicon nitride film (SiNx) or a multi-film thereof, but is not limited thereto. The bank 250 may be formed of an organic film such as an acrylic resin, an epoxy resin, a phenolic resin, a polyamide resin or a polyimide resin. According to the first embodiment of the present disclosure, the disconnection portion D may be disposed in the bank 250 disposed at boundary areas among the plurality of subpixels SP1, SP2, and SP3. The disconnection portion D may be formed from an upper surface of the bank 250 to a lower surface of the bank 250. In addition, the disconnection portion D may include an undercut area UC between the first electrode 210 and the bank 250. The undercut area UC is an area formed under an end of the bank 250 that extends past an end of the first electrode 210.

Referring to FIG. 3, the light emitting display device according to the first embodiment of the present disclosure may include a substrate SUB, a color filter layer CF, an overcoat layer OC, a first electrode 210 (e.g., anode electrode or pixel electrode), a bank 250, a light emitting element layer 220 (e.g., organic light emitting diode), and a second electrode 230 (e.g., cathode electrode or common electrode).

The substrate SUB may be a plastic film, a glass substrate, or a silicon wafer substrate SUB formed using a semiconductor process. The substrate SUB may be made of a transparent material, or may be made of an opaque material. According to various embodiments of the present disclosure, the light emitting display device may be provided in a bottom emission type in which light emitted from the plurality of subpixels SP1, SP2 and SP3 is emitted (image is displayed) to a lower portion through the substrate SUB. In this case, a transparent material may be used as the substrate SUB. The color filter layer CF may be disposed on the substrate SUB to correspond to the plurality of subpixels SP1, SP2 and SP3. For example, a first color filter layer CF1 shown in FIG. 3 may be a blue color filter that transmits blue light, and a second color filter layer CF2 may be a red color filter that transmits red light. Although not shown, a green color filter that transmits green light may also be provided. Meanwhile, when the light emitting display device according to various embodiments of the present disclosure is provided in a top emission type, the substrate SUB may be made of an opaque material, and the color filter layer CF may be formed on an encapsulation layer or may be formed on an opposite substrate that may be bonded to the substrate SUB by bonding.

A circuit element including various signal lines, a thin film transistor and a capacitor may be formed on the substrate SUB for each of the plurality of subpixels SP1, SP2 and SP3. The signal lines may include a gate line, a data line, a power line and a reference line, and the thin film transistor may include a switching thin film transistor, a driving thin film transistor and a sensing thin film transistor. Although not shown, at least one passivation layer may be formed on the circuit element.

The overcoat layer OC (or planarization layer) may be disposed on the color filter layer CF on the substrate SUB. The overcoat layer OC is to planarize a step difference at a lower portion, and may be made of an organic material such as photo acryl, polyimide, benzocyclobutene resin, and acrylate-based resin.

The first electrode 210 (e.g., anode electrode or pixel electrode) may be disposed on the overcoat layer OC. The first electrode 210 may be disposed in each of the plurality of subpixels SP1, SP2 and SP3. The first electrode 210 supplies a current (or voltage) to the light-emitting element layer 220, and may define a light emission area of a predetermined size, that is, a subpixel area. The first electrode 210 may be made of a transparent conductive material, for example, indium-tin-oxide (ITO) or indium-zinc-oxide (IZO), but is not limited thereto.

The bank 250 may be disposed on the first electrode 210. The bank 250 may cover an edge portion of the first electrode 210 and define an opening of the subpixel area. As shown in FIG. 2, the bank 250 may be disposed at a boundary area between the first subpixel SP1 and the second subpixel SP2, which have their respective colors different from each other. Also, the bank 250 may be disposed at a boundary area between the plurality of adjacent subpixels SP1, SP2 and SP3 of the same color corresponding to each of the plurality of subpixels SP1, SP2 and SP3. The bank 250 may be formed to surround the periphery of the edge of the first electrode 210. The bank 250 may be formed of an inorganic film deposited by a chemical vapor deposition (CVD) method or an atomic layer deposition (ALD) method, for example, a silicon oxide film (SiOx), a silicon nitride film (SiNx) or a multi-film thereof. Alternatively, the bank 250 may be formed of an organic film coated with a vapor deposition, printing, slit coating or ink-jet method, such as acrylic resin, epoxy resin, phenolic resin, polyamide resin, polyimide resin or a multi-film thereof.

According to the first embodiment of the present disclosure, the disconnection portion D may be disposed in the bank 250 disposed at the boundary areas among the plurality of subpixels SP1, SP2 and SP3. The disconnection portion D may be formed to be extended from the upper surface of the bank 250 to the lower surface of the bank 250. In addition, the disconnection portion D may include an undercut area UC between the first electrode 210 and the bank 250. The undercut area UC of the disconnection portion D may be disposed among the end of the first electrode 210 that overlaps the overcoat layer OC and the bank 250. That is, the undercut area UC is an area formed between a portion of the overcoat layer OC that overlaps an end of the bank 250 that extends past an end of the first electrode 210.

According to various embodiments of the present disclosure, when the bank 250 is deposited with an inorganic film, the disconnection portion D extended from the upper surface of the bank 250 to the lower surface of the bank 250 may be formed by performing a first etching process using a mask covering the other portion except the upper surface of the bank 250 disposed at the boundary areas between the subpixel areas. In addition, in a state that the mask remains, the first electrode 210 exposed through the disconnection portion D on the bank 250 may be patterned by performing a second etching process and patterned to be more inward than a side edge of the bank 250 penetrated through over-etching, whereby the undercut area UC may be formed in the disconnection portion D. The undercut area UC may be formed at the end of the first electrode 210, the overcoat layer OC and the bank 250. A step difference of the undercut area UC may correspond to a thickness of the first electrode 210, and the thickness of the first electrode 210 may be adjusted to adjust the degree of disconnection of the light emitting element layer 220 that will be formed later.

According to various embodiments of the present disclosure, when the bank 250 is coated with an organic film, the disconnection portion D extended from the upper surface of the bank 250 to the lower surface of the bank 250 may be formed by selectively removing the upper surface of the bank 250 disposed at the boundary area between the subpixel areas through a photolithography process. In addition, the first electrode 210 exposed through the disconnection portion D of the bank 250 may be patterned by performing an etching process and patterned to be more inward than the side edge of the bank 250 penetrated through over-etching, whereby the undercut area UC may be formed in the disconnection portion D.

After the disconnection portion D is formed on the bank 250, the opening defined to surround the periphery of the edge of the first electrode 210 may be formed to be patterned for each of the plurality of subpixels SP1, SP2 and SP3. The pattern formation of the opening may form an opening through which the first electrode 210 is exposed by an etching process using a mask covering the other portion except the opening to be patterned.

The light emitting element layer 220 may be disposed on the first electrode 210, the bank 250 and the disconnection portion D. According to various embodiments of the present disclosure, the light emitting element layer 220 may be a white light emitting layer emitting white light. In this case, the light emitting element layer 220 may be a common layer commonly formed for the plurality of subpixels SP1, SP2 and SP3.

When the light emitting element layer 220 is a white light emitting layer, the light emitting element layer 220 may be formed in a tandem structure of at least two stacks.

As shown in FIG. 4, the light emitting element layer 220 may include a first stack 221 emitting light of a first color, a second stack 222 emitting light of a second color, and a charge generation layer (CGL) 225 interposed between the first stack 221 and the second stack 222.

The first stack 221 may be disposed on the first electrode 210. The first stack 221 may have a structure in which a hole injection layer HIL, a hole transportation layer HTL, a first light emitting layer EML1 for emitting light of a first color, and an electron transportation layer ETL are sequentially deposited, but is not limited thereto. The first light emitting layer EML1 may be at least one of a red light emitting layer emitting red light, a green light emitting layer emitting green light, a blue light emitting layer emitting blue light or a yellow light emitting layer emitting yellow light, but is not limited thereto.

The charge generation layer 225 may be disposed on the first stack 221. The charge generation layer 225 may have a structure in which an N-type charge generation layer for providing electrons to the first stack 221 and a P-type charge generation layer for providing holes to the second stack 222 are deposited.

The second stack 222 may be disposed on the charge generation layer 225. The second stack 222 may have a structure in which a hole injection layer HIL, a hole transportation layer HTL, a second light emitting layer EML2 for emitting light of a second color and an electron transportation layer ETL are sequentially deposited, but is not limited thereto. The second light emitting layer EML2 may be at least one of a red light emitting layer emitting red light, a green light emitting layer emitting green light, a blue light emitting layer emitting blue light or a yellow light emitting layer emitting yellow light, but is not limited thereto. However, the second light emitting layer EML2 may emit light of a color different from that of the first light emitting layer EML1. For example, the first light emitting layer EML1 may be a blue light emitting layer emitting blue light, and the second light emitting layer EML2 may be a yellow light emitting layer emitting yellow light. For another example, the first light emitting layer EML1 may be a blue light emitting layer emitting blue light, and the second light emitting layer EML2 may be a red light emitting layer emitting red light or a green light emitting layer emitting green light.

The second electrode 230 may be disposed on the second stack 222. The second electrode 230 may be a common layer commonly formed for the plurality of subpixels SP1, SP2 and SP3. The second electrode 140 may be formed on the light emitting element layer 220 to provide electrons to the light emitting element layer 220.

Referring to FIG. 3, the first stack 221 may be disconnected in the disconnection portion D of the bank 250. The first stack 221 may be disconnected by the undercut area UC of the disconnection portion D. A portion of the first stack 221 (e.g., a first portion) may be formed on the bank 250 and a side of the bank 250 adjacent to the disconnection portion D. A portion of the first stack 221 formed on the bank 250 and the side of the bank 250 by the disconnection portion D may be a light emitting pattern that may emit light by being in contact with the first electrode 210 without being disconnected from the first electrode 210. That is, the portion of the first stack 221 is electrically connected to the first electrode 210.

In addition, another portion of the first stack 221 (e.g., a second portion) may be disconnected by the undercut area UC of the disconnection portion D, and may be formed on the overcoat layer OC exposed through the disconnection portion D. The other portion of the first stack 221 formed on the overcoat layer OC may be a non-light emitting pattern that is electrically disconnected from the light emitting pattern so as not to emit light without being in contact with the first electrode 210 that is more inward than the side edge of the bank 250 by a gap of the undercut area UC. At this time, a step difference t1 of the undercut area UC may be adjusted within the range that the first stack 221 is disconnected and the second electrode 230 is not disconnected. In addition, a width w of the gap of the undercut area UC may be greater than the thickness of the first stack 221. The step difference t1 of the undercut area UC may be adjusted by the thickness of the first electrode 210, and the first electrode 210 may have a thickness within the range that the first stack 221 is disconnected and the second electrode 230 is not disconnected. For example, the thickness of the first electrode 210 may be greater than ½ of the thickness of the first stack 221. For example, the first electrode 210 may have a thickness ranging from 500 Å to 2000 Å, but is not limited thereto. In addition, the gap width w of the undercut area UC may be adjusted by the degree of over-etching, and the degree of over-etching may be adjusted to be greater than the thickness of the first stack 221.

The charge generation layer 225 may be disconnected in the disconnection portion D of the bank 250. The charge generation layer 225 may be disconnected by the undercut area UC of the disconnection portion D. A portion of the charge generation layer 225 may be formed on the bank 250 and the side of the bank 250 adjacent to the disconnection portion D. A portion of the charge generation layer 225 formed on the bank 250 and the side of the bank 250 adjacent to the disconnection portion D may be a charge generation pattern that may provide electrons or holes between the first stack 221 and the second stack 222.

In addition, another portion of the charge generation layer 225 may be disconnected by the undercut area UC of the disconnection portion D, and may be formed on the first stack 221 on the overcoat layer OC exposed through the disconnection portion D, that is, the non-light emitting pattern. Other portion of the charge generation layer 225 formed on the non-light emitting pattern may be a charge non-generation pattern that is electrically disconnected from the charge generation pattern so as not to provide electrons or holes without being in contact with the first electrode 210 that is more inward than the side edge of the bank 250 by the gap of the undercut area UC.

At this time, the step difference t1 of the undercut area UC may be adjusted within the range that the first stack 221 and the charge generation layer 225 are disconnected and the second electrode 230 is not disconnected. In addition, the width w of the gap of the undercut area UC may be greater than a sum of the thickness of the first stack 221 and the thickness of the charge generation layer 225. The step difference t1 of the undercut area UC may be adjusted by the thickness of the first electrode 210, and the first electrode 210 may have a thickness within the range that the first stack 221 and the charge generation layer 225 are disconnected and the second electrode 230 is not disconnected. For example, the thickness of the first electrode 210 may be greater than ½ of the sum of the thickness of the first stack 221 and the thickness of the charge generation layer 225. For example, the first electrode 210 may have a thickness ranging from 500 Å to 2000 Å, but is not limited thereto. In addition, the gap width of the undercut area UC may be adjusted by the degree of over-etching, and the degree of over-etching may be adjusted to be greater than the sum of the thickness of the first stack 221 and the thickness of the charge generation layer 225.

The second stack 222 may not be disconnected within the disconnection portion D of the bank 250. The second stack 222 may be extended continuously from the first subpixel SP1 area to the second subpixel SP2 area without disconnection by the step difference mitigated by the first stack 221 and the charge generation layer 225, which are formed in the disconnection portion D, but is not limited thereto. The first electrode 210 may be formed to be higher such that the undercut area UC of the disconnection portion D may have a great step difference, whereby the second stack 222 may be disconnected in the disconnection portion D. The height of the first electrode 210 may be adjusted to an extent that the second electrode 230 to be disposed on the light emitting element layer 220 may not be disconnected.

The second electrode 230 may be disposed on the second stack 222. The second electrode 230 may not be disconnected in the disconnection portion D of the bank 250, and may be extended continuously from the first subpixel SP1 area to the second subpixel SP2 area without disconnection by the step difference mitigated by the first stack 221, the charge generation layer 225 and the second stack 222, which are formed in the disconnection portion D.

Second Embodiment

Figure 5:
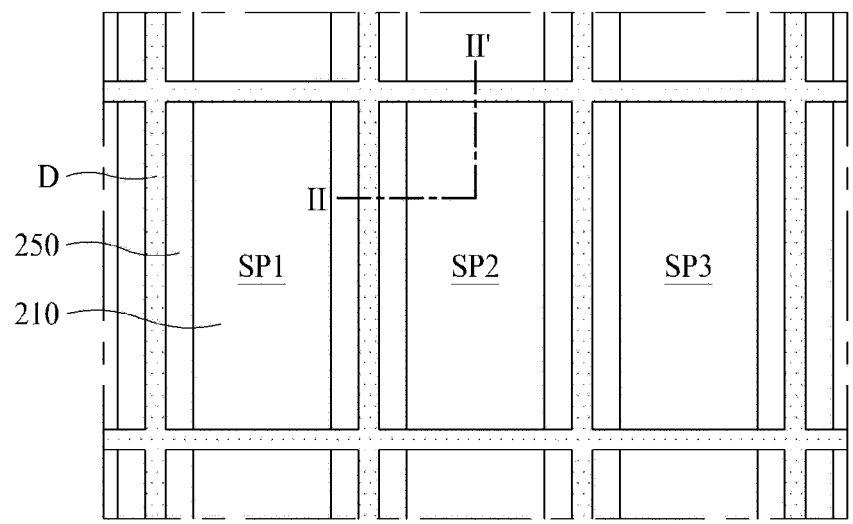
FIG. 5 is a schematic plane view illustrating a first electrode, a bank and a disconnection portion of subpixels in a light emitting display device according to the second embodiment of the present disclosure.
Figure 6:
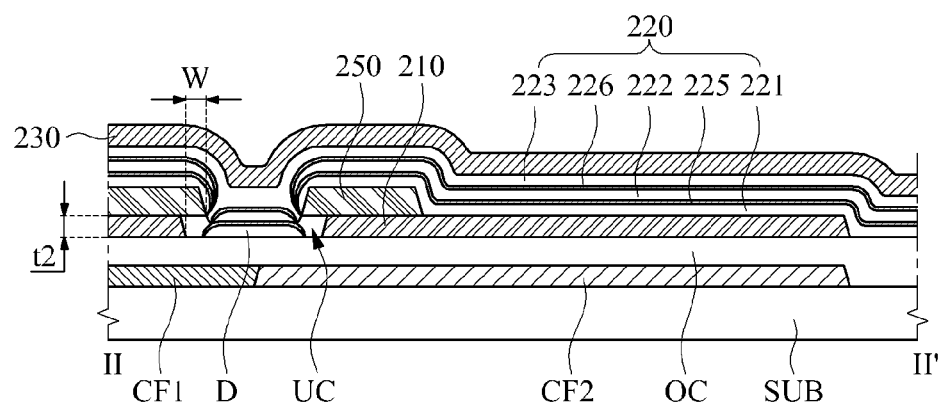
FIG. 6 is a cross-sectional view taken along line II-II' of FIG. 5 according to the second embodiment of the present disclosure.
Figure 7:
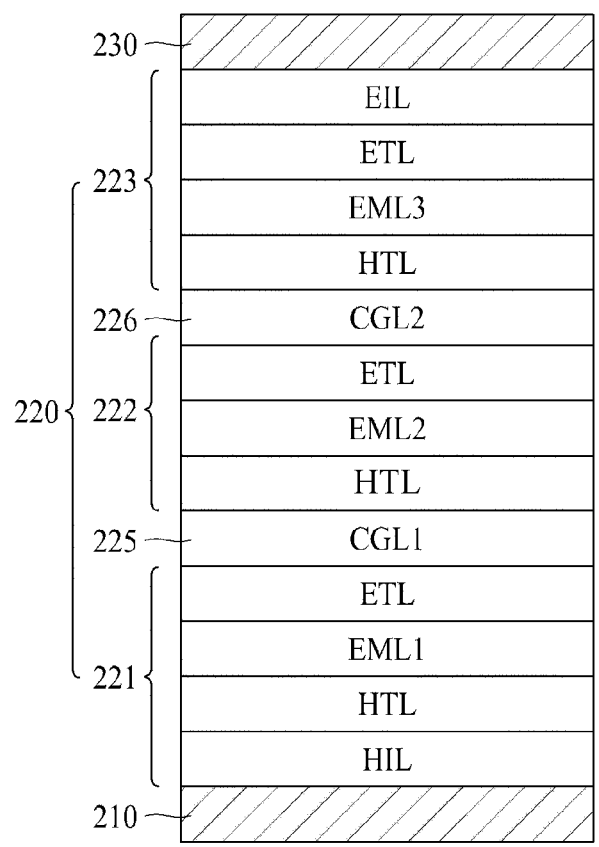
FIG. 7 is a cross-sectional view illustrating another example of a first electrode, a light emitting element layer and a second electrode in a light emitting display device according to various embodiments of the present disclosure.

FIG. 5 is a schematic plane view illustrating a first electrode, a bank and a disconnection portion of subpixels in a light emitting display device according to the second embodiment of the present disclosure. FIG. 6 is a cross-sectional view taken along line II-II' of FIG. 4 according to the second embodiment of the present disclosure. FIG. 7 is a cross-sectional view illustrating another example of a first electrode, a light emitting element layer and a second electrode in a light emitting display device according to various embodiments of the present disclosure.

Referring to FIGS. 5 to 7 in conjunction with FIG. 1, a display panel 110 of a light emitting display device according to the second embodiment of the present disclosure is categorized into a display area AA and a non-display area NA, and may include a first electrode 210, a bank 250, a light emitting element layer 220, a second electrode 230 and a disconnection portion D on the bank 250 on a substrate SUB having a plurality of subpixel areas in the display area AA.

Since elements of the light emitting display device according to the second embodiment of the present disclosure shown in FIGS. 5 to 7 are substantially the same as those of the light emitting display device according to the first embodiment of the present disclosure shown in FIGS. 2 to 4 except for a structure of the first electrode 210, a structure of the light emitting element layer 220 and a structure of the bank 250, their detailed description will be omitted.

The light emitting display device according to the second embodiment of the present disclosure shown in FIGS. 5 to 7 is different from the light emitting display device according to the first embodiment of the present disclosure shown in FIGS. 2 to 3 in that the first electrode 210 is adjusted to be thicker than the first electrode 210 shown in FIGS. 2 and 3. As the thickness of the first electrode 210 is increased, the stacks of the light emitting element layer 220 may be changed. The light emitting element layer 220 may include a first stack 221, a first charge generation layer 225, a second stack 222, a second charge generation layer 226, and a third stack 223. As the thickness of the first electrode 210 is increased, a structure for preventing the second electrode 230 from being disconnected at a boundary area with another subpixel adjacent thereto has been adopted.

Referring to FIGS. 5 and 6, the light emitting display device according to the second embodiment of the present disclosure may include a substrate SUB, a color filter layer CF, an overcoat layer OC, a first electrode 210 (e.g., anode electrode or pixel electrode), a bank 250, a light emitting element layer 220 (e.g., organic light emitting diode), and a second electrode 230 (e.g., cathode electrode or common electrode).

A circuit element including various signal lines, a thin film transistor and a capacitor may be formed on the substrate SUB for each of the plurality of subpixels SP1, SP2 and SP3, and the color filter layer CF may be disposed to correspond to each of the plurality of subpixels SP1, SP2 and SP3.

The overcoat layer OC (or planarization layer) may be disposed on the color filter layer CF on the substrate SUB. The first electrode 210 (e.g., anode electrode or pixel electrode) may be disposed on the overcoat layer OC.

The bank 250 may be disposed on the first electrode 210. The bank 250 may cover an edge portion of the first electrode 210 and define an opening of the subpixel area. As shown in FIG. 5, the bank 250 may be disposed to cover an edge portion of each of the first electrodes 120 between the first subpixel SP1 and the second subpixel SP2, between the second subpixel SP2 and the third subpixel SP3 and between the third subpixel SP3 and the first subpixel SP1, which have their respective colors different from each other. Also, the bank 250 may be not disposed on the first electrodes 210 between the plurality of adjacent subpixels SP1, SP2 and SP3 of the same color corresponding to each of the plurality of subpixels SP1, SP2 and SP3 (bankless structure). The bank 250 may be formed of an inorganic film, for example, a silicon oxide film (SiOx), a silicon nitride film (SiNx) or a multi-film thereof.

According to the second embodiment of the present disclosure, the disconnection portion D may be disposed in the bank 250 disposed at the boundary areas among the plurality of subpixels SP1, SP2 and SP3. The disconnection portion D may be formed to be extended from the upper surface of the bank 250 to the lower surface of the bank 250.

In addition, the disconnection portion D may include an undercut area UC between the first electrode 210 and the bank 250. The undercut area UC of the disconnection portion D may be disposed among the end of the first electrode 210, the overcoat layer OC and the bank 250. That is, the undercut area UC is formed under an end of the bank 240 that extends past an end of the first electrode 210.

The light emitting element layer 220 may be disposed on the first electrodes 210, the bank 250 and the disconnection portion D. According to various embodiments of the present disclosure, the light emitting element layer 220 may be a white light emitting layer emitting white light. In this case, the light emitting element layer 220 may be a common layer commonly formed for the plurality of subpixels SP1, SP2 and SP3.

When the light emitting element layer 220 is a white light emitting layer, the light emitting element layer 220 may be formed in a tandem structure of at least three stacks.

As shown in FIG. 7, the light emitting element layer 220 may include a first stack 221 emitting light of a first color, a second stack 222 emitting light of a second color, a third stack 223 emitting light of a third color, a first charge generation layer (CGL1) 225 interposed between the first stack 221 and the second stack 222, and a second charge generation layer (CGL2) 226 interposed between the second stack 222 and the third stack 223.

The first stack 221 may be disposed on the first electrode 210. The first stack 221 may have a stricture in which a hole injection layer HIL, a hole transportation layer HTL, a first light emitting layer EML1 for emitting light of a first color, and an electron transportation layer ETL are sequentially deposited, but is not limited thereto. The first light emitting layer EML1 may be at least one of a red light emitting layer emitting red light, a green light emitting layer emitting green light, or a blue light emitting layer emitting blue light, but is not limited thereto.

The first charge generation layer 225 may be disposed on the first stack 221, and the second stack 222 may be disposed on the first charge generation layer 225.

The second stack 222 may have a structure in which a hole injection layer HIL, a hole transportation layer HTL, a second light emitting layer EML2 for emitting light of a second color and an electron transportation layer ETL are sequentially deposited, but is not limited thereto.

The second light emitting layer EML2 may be at least one of a red light emitting layer emitting red light, a green light emitting layer emitting green light or a blue light emitting layer emitting blue light, but is not limited thereto. However, the second light emitting layer EML2 may emit light of a color different from that of the first light emitting layer EML1.

The second charge generation layer 226 may be disposed on the second stack 222, and the third stack 223 may be disposed on the second charge generation layer 226.

The third stack 223 may have a structure in which a hole injection layer HIL, a hole transportation layer HTL, a third light emitting layer EML3 for emitting light of a third color and an electron transportation layer ETL are sequentially deposited, but is not limited thereto.

The third light emitting layer EML3 may be at least one of a red light emitting layer emitting red light, a green light emitting layer emitting green light or a blue light emitting layer emitting blue light, but is not limited thereto. However, the third light emitting layer EML3 may emit light of a color different from that of each of the first light emitting layer EML1 and the second light emitting layer EML2. For example, the first light emitting layer EML1 may be a blue light emitting layer emitting blue light, the second light emitting layer EML2 may be a blue light emitting layer emitting red light, and the third light emitting layer EML3 may be a blue light emitting layer emitting green light. Various modifications may be made in the order of colors of light emitted from the first light emitting layer EML1, the second light emitting layer EML2 and the third light emitting layer EML3.

The second electrode 230 may be disposed on the third stack 223. The second electrode 230 may be a common layer commonly formed for the plurality of subpixels SP1, SP2 and SP3. The second electrode 140 may be formed on the light emitting element layer 220 to provide electrons to the light emitting element layer 220.

Referring to FIG. 6, the first stack 221 may be disconnected within the disconnection portion D of the bank 250. The first stack 221 may be disconnected by the undercut area UC of the disconnection portion D.

The first charge generation layer 225 may be disconnected in the disconnection portion D of the bank 250. The first charge generation layer 225 may be disconnected by the undercut area UC of the disconnection portion D.

The second stack 222 may be disconnected within the disconnection portion D of the bank 250. The second stack 222 may be disconnected by the undercut area UC of the disconnection portion D.

The second charge generation layer 226 may be disconnected within the disconnection portion D of the bank 250. The second charge generation layer 226 may be disconnected by the undercut area UC of the disconnection portion D.

At this time, a step difference t2 of the undercut area UC may be adjusted within the range that the first stack 221, the first charge generation layer 225, the second stack 222 and the second charge generation layer 226 are disconnected. The step difference t2 of the undercut area UC may be adjusted by a thickness of the first electrode 210, and the first electrode 210 may have a thickness within the range that the first stack 221, the first charge generation layer 225, the second stack 222 and the second charge generation layer 226 are disconnected. For example, the thickness of the first electrode 210 may be greater than ½ of a sum of thicknesses of the first stack 221, the first charge generation layer 225, the second stack 222 and the second charge generation layer 226. For example, the first electrode 210 may have a thickness ranging from 1000 Å to 5000 Å, but is not limited thereto. In addition, a gap width of the undercut area UC may be adjusted by the degree of over-etching, and the degree of over-etching may be adjusted to be greater than the sum of the thicknesses of the first stack 221, the first charge generation layer 225, the second stack 222 and the second charge generation layer 226.

The third stack 223 may not be disconnected within the disconnection portion D of the bank 250. The third stack 223 may be extended continuously from the first subpixel SP1 area to the second subpixel SP2 area by the step difference mitigated by the first stack 221, the first charge generation layer 225, the second stack 222 and the second charge generation layer 226, which are formed in the disconnection portion D, but is not limited thereto. The first electrode 210 may be formed to be higher such that the undercut area UC of the disconnection portion D may have a great step difference, whereby the third stack 223 may be disconnected in the disconnection portion D. The height of the first electrode 210 may be adjusted to an extent that the second electrode 230 to be disposed on the light emitting element layer 220 may not be disconnected.

Third Embodiment

Figure 8:
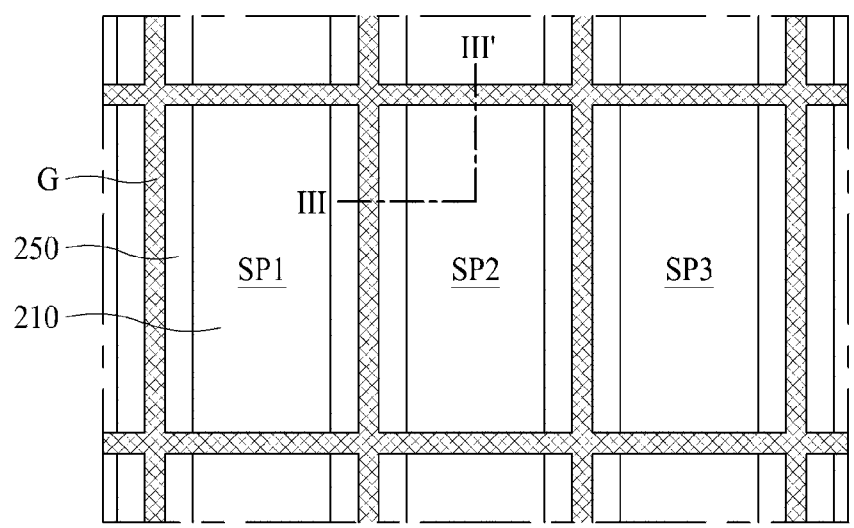
FIG. 8 is a schematic plane view illustrating a first electrode, a bank and a groove of subpixels in a light emitting display device according to the third embodiment of the present disclosure.
Figure 9:
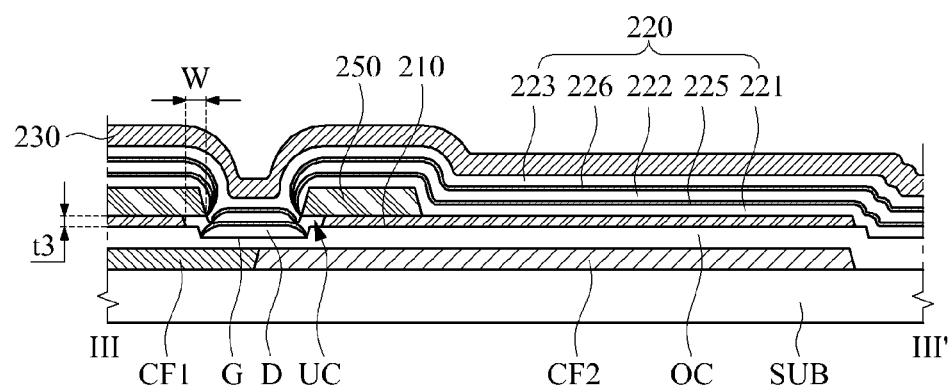
FIG. 9 is a cross-sectional view taken along line III-III' of FIG. 8 according to the third embodiment of the present disclosure.

FIG. 8 is a schematic plane view illustrating a first electrode, a bank and a groove of subpixels in a light emitting display device according to the third embodiment of the present disclosure. FIG. 9 is a cross-sectional view taken along line III-III' of FIG. 8 according to the third embodiment of the present disclosure.

Referring to FIGS. 8 and 9 in conjunction with FIGS. 1 and 7, a display panel 110 of a light emitting display device according to the third embodiment of the present disclosure is categorized into a display area AA and a non-display area NA, and may include a first electrode 210, a bank 250, a light emitting element layer 220, a second electrode 230 and a groove G on an overcoat layer OC exposed by a disconnection portion D on the bank 250, on a substrate SUB having a plurality of subpixel areas in the display area AA.

Since elements of the light emitting display device according to the third embodiment of the present disclosure shown in FIGS. 8 and 9 are substantially the same as those of the light emitting display device according to the first embodiment of the present disclosure shown in FIG. 2 to 4 or the light emitting display device according to the second embodiment of the present disclosure shown in FIGS. 5 to 7 except for a structure in which the groove G is formed on the overcoat layer OC exposed by the disconnection portion D on the bank 250, their detailed description will be omitted.

The light emitting display device according to the third embodiment of the present disclosure shown in FIGS. 8 and 9 is different from the light emitting display device shown in FIGS. 2 to 4 or FIGS. 5 to 7 in that the groove G is formed on the overcoat layer OC exposed by the disconnection portion D on the bank 250.

Referring to FIGS. 8 and 9, the light emitting display device according to the third embodiment of the present disclosure may include a substrate SUB, a color filter layer CF, an overcoat layer OC, a first electrode 210 (e.g., anode electrode or pixel electrode), a bank 250, a light emitting element layer 220 (e.g., organic light emitting diode), a second electrode 230 (e.g., cathode electrode or common electrode), and a groove G on the overcoat layer OC.

A circuit element including various signal lines, a thin film transistor and a capacitor may be formed on the substrate SUB for each of the plurality of subpixels SP1, SP2 and SP3, and the color filter layer CF may be disposed to correspond to each of the plurality of subpixels SP1, SP2 and SP3.

The overcoat layer OC (or planarization layer) may be disposed on the color filter layer CF on the substrate SUB. The first electrode 210 (e.g., anode electrode or pixel electrode) may be disposed on the overcoat layer OC.

The bank 250 may be disposed on the first electrode 210. The bank 250 may cover an edge portion of the first electrode 210 and define an opening of the subpixel area. As shown in FIG. 8, the bank 250 may be disposed to cover an edge portion of each of the first electrodes 120 between the first subpixel SP1 and the second subpixel SP2, between the second subpixel SP2 and the third subpixel SP3 and between the third subpixel SP3 and the first subpixel SP1, which have their respective colors different from each other. Also, the bank 250 may be not disposed on the first electrodes 210 between the plurality of adjacent subpixels SP1, SP2 and SP3 of the same color corresponding to each of the plurality of subpixels SP1, SP2 and SP3 (bankless structure). The bank 250 may be formed of an inorganic film, for example, a silicon oxide film (SiOx), a silicon nitride film (SiNx) or a multi-film thereof.

According to the third embodiment of the present disclosure, the groove G of a certain depth may be formed on the overcoat layer OC exposed by the disconnection portion D of the bank 250 disposed at the boundary areas among the plurality of subpixels SP1, SP2 and SP3. The disconnection portion D may include an undercut area UC between the first electrode 210 and the bank 250. The undercut area UC of the disconnection portion D may be disposed between a portion of the groove G and an end of the bank 250 that extends past an end of the first electrode 210.

According to various embodiments of the present disclosure, when the bank 250 is deposited with an inorganic film, the groove G may be formed as follows. The disconnection portion D extended from the upper surface of the bank 250 to the lower surface of the bank 250 may be formed by performing a first etching process using a mask covering the other portion except the upper surface of the bank 250 disposed at the boundary area between the subpixel areas. In a state that the mask remains, the first electrode 210 exposed through the disconnection portion D on the bank 250 may be patterned by performing a second etching process and patterned to be more inward than a side edge of the bank 250 penetrated through over-etching, whereby the undercut area UC may be formed in the disconnection portion D. In addition, in a state that the mask remains, the groove G of a certain depth may be formed on the overcoat layer OC exposed through the disconnection portion D on the bank 250 and the first electrode 210 removed by over-etching by performing a third etching process. Since a step difference may additionally be formed by the groove G on the overcoat layer OC, the thickness of the first electrode 210 may be adjusted to be small. The undercut area UC of the disconnection portion D may be disposed among the end of the first electrode 210, the groove G and the bank 250.

The light emitting element layer 220 may be disposed on the first electrodes 210, the bank 250 and the groove G. According to various embodiments of the present disclosure, the light emitting element layer 220 may be a white light emitting layer emitting white light, and as shown in FIG. 7, may be formed in a tandem structure of at least three stacks.

Referring to FIG. 9, the first stack 221 may be disconnected by the step difference of the undercut area UC of the bank 250 and the groove G.

The first charge generation layer 225 may be disconnected by the step difference of the undercut area UC of the bank 250 and the groove G.

The second stack 222 may be disconnected by the step difference of the undercut area UC of the bank 250 and the groove G.

The second charge generation layer 226 may be disconnected by the step difference of the undercut area UC of the bank 250 and the groove G.

At this time, a step difference t3 of the undercut area UC and the groove G may be adjusted within the range that the first stack 221, the first charge generation layer 225, the second stack 222 and the second charge generation layer 226 are disconnected. The step difference of the undercut area UC may be adjusted by a thickness of the first electrode 210, and the step difference of the groove G may be adjusted by an etching level. A sum of the thickness of the first electrode 210 and the step difference of the groove G may have a size within the range that the first stack 221, the first charge generation layer 225, the second stack 222 and the second charge generation layer 226 are disconnected. For example, the sum of the thickness of the first electrode 210 and the step difference of the groove G may be greater than ½ of a sum of thicknesses of the first stack 221, the first charge generation layer 225, the second stack 222 and the second charge generation layer 226. For example, the step difference of the groove G may range from 2000 Å to 1 μm, and the thickness of the first electrode 210 may range from 500 Å to 2000 Å, but are not limited thereto.

The third stack 223 may not be disconnected by the step difference t3 of the undercut area UC and the groove G. The third stack 223 may be extended continuously from the first subpixel SP1 area to the second subpixel SP2 area by the step difference mitigated by the first stack 221, the first charge generation layer 225, the second stack 222 and the second charge generation layer 226, which are formed on the groove G, but is not limited thereto. The first electrode 210 may be formed to be higher or the groove G may be formed to be deeper such that the undercut area UC and the groove G may have a greater step difference, whereby the third stack 223 may be disconnected by the step difference of the undercut area UC and the groove G.

Fourth Embodiment

Figure 10:
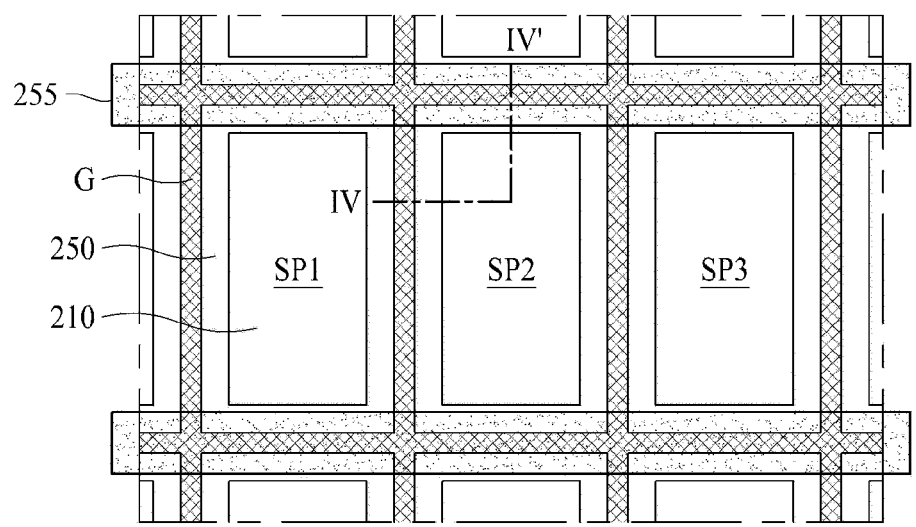
FIG. 10 is a schematic plane view illustrating a first electrode, a first bank, a groove and a second bank of subpixels in a light emitting display device according to the fourth embodiment of the present disclosure.
Figure 11:
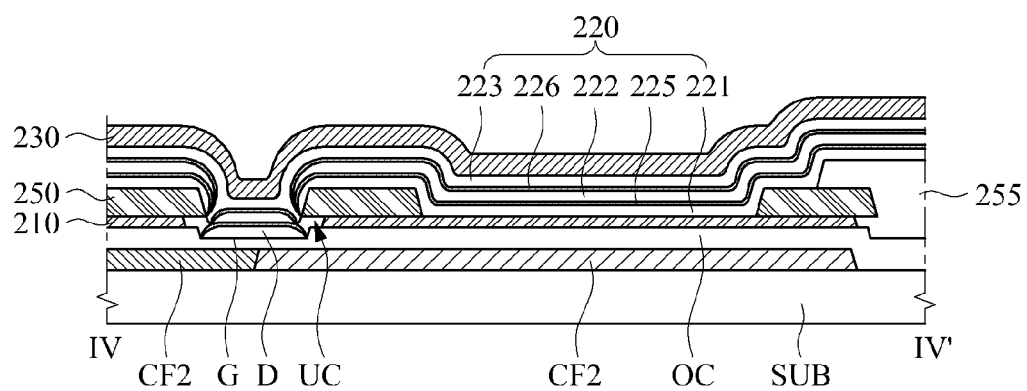
FIG. 11 is a cross-sectional view taken along line IV-IV' of FIG. 10 according to the fourth embodiment of the present disclosure.

FIG. 10 is a schematic plane view illustrating a first electrode, a first bank, a groove and a second bank of subpixels in a light emitting display device according to the fourth embodiment of the present disclosure. FIG. 11 is a cross-sectional view taken along line IV-IV' of FIG. 10 according to the fourth embodiment of the present disclosure.

Referring to FIGS. 10 and 11 in conjunction with FIGS. 1 and 7, a display panel 110 of a light emitting display device according to the fourth embodiment of the present disclosure is categorized into a display area AA and a non-display area NA, and may include a first electrode 210, a bank 250, a light emitting element layer 220, a second electrode 230, a groove G on an overcoat layer OC exposed by a disconnection portion D on the bank 250, and a second bank 255 added on the bank 250, on a substrate SUB having a plurality of subpixel areas in the display area AA.

Since elements of the light emitting display device according to the fourth embodiment of the present disclosure shown in FIGS. 10 and 11 are substantially the same as those of the light emitting display device according to the first embodiment, the second embodiment or the third embodiment except for a structure of the second bank 255 additionally formed on the bank 250, their detailed description will be omitted.

Referring to FIGS. 10 and 11, the light emitting display device according to the fourth embodiment of the present disclosure may include a substrate SUB, a color filter layer CF, an overcoat layer OC, a first electrode 210 (e.g., anode electrode or pixel electrode), a bank 250, a light emitting element layer 220 (e.g., organic light emitting diode), a second electrode 230 (e.g., cathode electrode or common electrode), a groove G on the overcoat layer OC, and a second bank 255 added on the bank 250.

A circuit element including various signal lines, a thin film transistor and a capacitor may be formed on the substrate SUB for each of the plurality of subpixels SP1, SP2 and SP3, and the color filter layer CF may be disposed to correspond to each of the plurality of subpixels SP1, SP2 and SP3.

The overcoat layer OC (or planarization layer) may be disposed on the color filter layer CF on the substrate SUB. The first electrode 210 (e.g., anode electrode or pixel electrode) may be disposed on the overcoat layer OC.

The bank 250 may be disposed on the first electrode 210. The bank 250 may cover an edge portion of the first electrode 210 and define an opening of the subpixel area. As shown in FIG. 10, the bank 250 may be disposed at a boundary area between the first subpixel SP1 and the second subpixel SP2, which have their respective colors different from each other. Also, the bank 250 may be disposed at boundary areas among the plurality of adjacent subpixels SP1, SP2 and SP3 of the same color corresponding to each of the plurality of subpixels SP1, SP2 and SP3. The bank 250 may be formed to surround the periphery of the edge of the first electrode 210. The bank 250 may be formed of an inorganic film coated with a vapor deposition, printing, slit coating or ink-jet method, such as acrylic resin, epoxy resin, phenolic resin, polyamide resin, polyimide resin or a multi-film thereof.

According to the fourth embodiment of the present disclosure, the groove G of a certain depth may be formed on the overcoat layer OC exposed by the disconnection portion D of the bank 250 disposed at the boundary areas among the plurality of subpixels SP1, SP2 and SP3. The disconnection portion D may include an undercut area UC between the first electrode 210 and the bank 250. The undercut area UC of the disconnection portion D may be disposed between a portion of the groove G that overlaps with an end of the bank 250 that extends past an end of the first electrode 210.

According to the fourth embodiment of the present disclosure, in order to prevent the second electrode 230 from being disconnected by the bank 250 disposed at the boundary areas among the plurality of adjacent subpixels SP1, SP2 and SP3 of the same color, the undercut area UC of the bank 250, and the groove G of the overcoat layer OC, the second bank 255 may be disposed on the bank 250 of the corresponding area, the undercut area UC of the bank 250 and the groove G of the overcoat layer OC. The second bank 255 may prevent the second electrode 230 from being disconnected due to a step difference mitigated in the form of a step.

Fifth Embodiment

Figure 12:
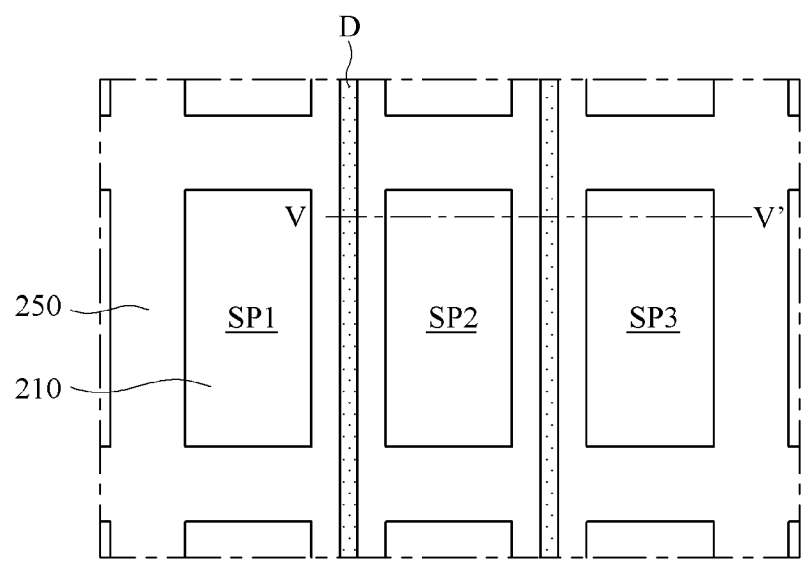
FIG. 12 is a plan view schematically illustrating a first electrode, a bank, and a disconnection portion of subpixels in a light emitting display device according to a fifth embodiment of the present disclosure.
Figure 13:
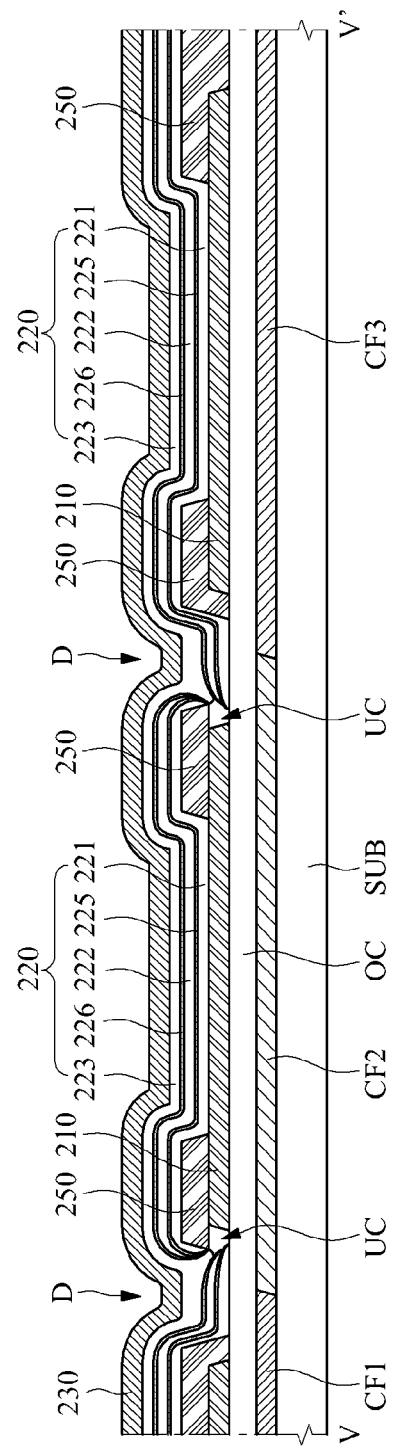
FIG. 13 is a cross-sectional view taken along line V-V' of FIG. 12 according to the fifth embodiment of the present disclosure.

FIG. 12 is a plan view schematically illustrating a first electrode, a bank, and a disconnection portion of subpixels in a light emitting display device according to a fifth embodiment of the present disclosure. FIG. 13 is a cross-sectional view taken along line V-V' of FIG. 12 according to the fifth embodiment of the present disclosure.

Referring to FIGS. 12 and 13 in conjunction with FIG. 1, a display panel 110 of a light emitting display according to a fifth embodiment of the present disclosure may be divided into a display area AA and a non-display area NA. The display panel 110 may include a substrate SUB having a plurality of subpixel areas in the display area AA, a first electrode 210, a bank 250, a light emitting element layer 220, a second electrode 230, and a disconnection portion D on the bank 250, disposed on the substrate SUB.

Since the configuration of the light emitting display device according to the fifth embodiment of the present disclosure shown in FIGS. 12 and 13 is substantially the same as the configuration of the light emitting display device according to the second embodiment of the present disclosure shown in FIGS. 5 to 7, except for the structure of the first electrode 210, the structure of the light emitting element layer 220, and the structure of the bank 250, no detailed description thereof is given.

The disconnection portion D including an undercut area UC in the light emitting display device according to the fifth embodiment of the present disclosure shown in FIGS. 12 and 13 differs from the structure of the disconnection portion D shown in FIGS. 5 to 7 in that it is positioned only in a partial area of the areas between the subpixels.

Referring to FIGS. 12 and 13, there may be included a substrate SUB, a color filter layer CF, an overcoat layer OC, a first electrode 210 (e.g., an anode electrode or a pixel electrode), a bank 250, a light emitting element layer 220 (e.g., an organic light emitting diode), and a second electrode 230 (e.g., a cathode electrode or a common electrode).

For each of a plurality of subpixels SP1, SP2, and SP3, circuit elements including, e.g., capacitors, thin film transistors, and various signal lines may be formed on the substrate SUB. A color filter layer CF may be disposed to correspond to each of the plurality of subpixels SP1, SP2, and SP3. For example, a first color filter layer CF1 may be a blue color filter that transmits blue light. A second color filter layer CF2 may be a red color filter that transmits red light. A third color filter layer CF3 may be a green color filter that transmits green light.

The overcoat layer OC (or a planarization layer) may be disposed on the color filter layer CF on the substrate SUB. The first electrode 210 (e.g., an anode electrode or a pixel electrode) may be disposed on the overcoat layer OC.

The bank 250 may be disposed on the first electrode 210. The bank 250 may cover an edge portion of the first electrode 210 and define an opening in the subpixel area. The bank 250 may include an opening positioned in a portion of a boundary portion between the subpixel areas. The disconnection portion D may be positioned in the opening of the bank 250 positioned in the boundary portion between the subpixel areas.

The disconnection portion D may be positioned only in a partial area among the areas between the plurality of subpixels SP1, SP2, and SP3.

For example, the disconnection portion D may be positioned between the first subpixel SP1 and the second subpixel SP2. The disconnection portion D may be positioned between the second subpixel SP2 and the third subpixel SP3. The disconnection portion D may not be positioned between the third subpixel SP3 and the first subpixel SP1.

The disconnection portion D may be formed by penetrating from the top surface of the bank 250 to the bottom surface of the bank 250. The disconnection portion D may include an undercut area UC formed under an end of the bank 250 that extends past an end of the first electrode 210. The undercut area UC may be positioned only in an area adjacent to one subpixel among subpixels positioned on two opposite sides of the disconnection portion D.

For example, the disconnection portion D positioned between the first subpixel SP1 and the second subpixel SP2 may include the undercut area UC formed by the first electrode 210 and the bank 250 of the second subpixel SP2. The undercut area UC may not be positioned on one side of the first subpixel SP1. An outer surface of the first electrode 210 of the first subpixel SP1 may be disposed to be surrounded by the bank 250.

The disconnection portion D positioned between the second subpixel SP2 and the third subpixel SP3 may include the undercut area UC formed by the first electrode 210 and the bank 250 of the second subpixel SP2. The undercut area UC may not be positioned on one side of the third subpixel SP3. An outer surface of the first electrode 210 of the third subpixel SP3 may be disposed to be surrounded by the bank 250.

The bank 250 disposed in the area between the third subpixel SP3 and the first subpixel SP1 may not include the disconnection portion D. The bank 250 may be disposed in an edge portion of the first electrode 210 of the third subpixel SP3, an edge portion of the first electrode 210 of the first subpixel SP1, and the area between the third subpixel SP3 and the first subpixel SP1.

The bank 250 may be disposed to overall surround an edge portion of the first electrode 210 of the first subpixel SP1. The bank 250 may be disposed to overall surround an edge portion of the first electrode 210 of the third subpixel SP3.

Since the undercut area UC is positioned on two opposite sides of the first electrode 210 of the second subpixel SP2, at least a portion of the light emitting element layer 220 disposed in the undercut area UC may be disconnected.

A first stack 221, a first charge generation layer 225, a second stack 222, and a second charge generation layer 226 of the light emitting element layer 220 may be disconnected in the undercut area UC of the disconnection portion D positioned between the second subpixel SP2 and the first subpixel SP1. The light emitting element layer 250 is not disconnected but may be continuously disposed on the bank 250 covering the first electrode 210 of the first subpixel SP1 where the undercut area UC is not positioned.

A first stack 221, a first charge generation layer 225, a second stack 222, and a second charge generation layer 226 of the light emitting element layer 220 may be disconnected in the undercut area UC of the disconnection portion D positioned between the second subpixel SP2 and the third subpixel SP3. The light emitting element layer 250 is not disconnected but may be continuously disposed on the bank 250 covering the first electrode 210 of the third subpixel SP3 where the undercut area UC is not positioned.

The leakage current flowing from the second subpixel SP2 to the first subpixel SP1 and the third subpixel SP3 may be blocked by a structure in which a portion of the light emitting element layer 220 is disconnected in the disconnection portion D. Further, the leakage current flowing from the first subpixel SP1 and the third subpixel SP3 to the second subpixel SP2 may be blocked.

Since the leakage current flowing to the adjacent subpixel is blocked, the light emitting element layer 220 of another subpixel may be prevented from emitting light by the current driving the light emitting element layer 220 of the adjacent subpixel.

Since the edge portion of the first electrode 210 where the undercut area UC is not formed in the disconnection portion D is covered by the bank 250, the edge portion of the first electrode 210 or the upper surface of the overcoat layer OC positioned on one side of the first electrode 210 may be prevented from damage upon etching.

It is possible to prevent or at least reduce abnormalities in driving the display due to the leakage current flowing to the adjacent subpixel while reducing defects that may occur in the first electrode 210 and the bank 250 in the process.

The subpixel where the undercut area UC is positioned may be a subpixel emitting a specific color of light.

For example, the second subpixel SP2 may be an area emitting red light or blue light. The first subpixel SP1 and the third subpixel SP3 may be areas emitting light other than red light or blue light and may be areas that emit green light or white light.

The subpixel emitting green light or white light may be prevented from emitting light due to the leakage of the current supplied to the subpixel emitting red light or blue light.

The subpixel emitting green light or white light, which has high visually perceptible characteristics may be prevented from malfunctioning due to the leakage current of the adjacent subpixel. It is possible to prevent abnormalities in driving the display, such as variations in color coordinates due to the leakage current between adjacent subpixels.

Further, since the undercut area UC is formed only on side portions of some subpixels, it is possible to prevent defects in the side portion of the subpixel in the process of forming the undercut area UC.

Sixth Embodiment

Figure 14:
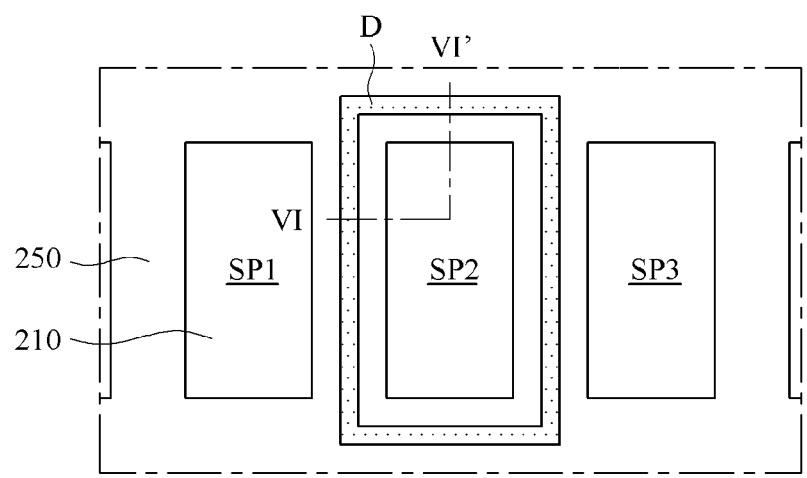
FIG. 14 is a plan view schematically illustrating a first electrode, a bank, and a disconnection portion of subpixels in a light emitting display device according to a sixth embodiment of the present disclosure.
Figure 15:
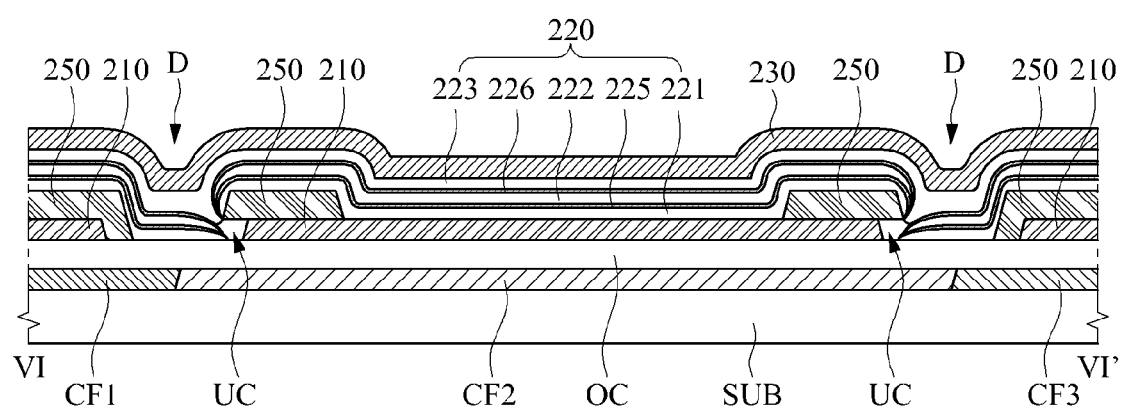
FIG. 15 is a cross-sectional view taken along line VI-VI' of FIG. 14 according to the sixth embodiment of the present disclosure.

FIG. 14 is a plan view schematically illustrating a first electrode, a bank, and a disconnection portion of subpixels in a light emitting display device according to a sixth embodiment of the present disclosure. FIG. 15 is a cross-sectional view taken along line VI-VI' of FIG. 14 according to the sixth embodiment of the present disclosure.

Referring to FIGS. 14 and 15 in conjunction with FIG. 1, a display panel 110 of a light emitting display according to a sixth embodiment of the present disclosure may be divided into a display area AA and a non-display area NA. The display panel 110 may include a substrate SUB having a plurality of subpixel areas in the display area AA, a first electrode 210, a bank 250, a light emitting element layer 220, a second electrode 230, and a disconnection portion D on the bank 250, disposed on the substrate SUB.

Since the configuration of the light emitting display device according to the fifth embodiment of the present disclosure shown in FIGS. 14 and 15 is substantially the same as the configuration of the light emitting display device according to the second embodiment of the present disclosure shown in FIGS. 5 to 7 or the configuration of the light emitting display device according to the fifth embodiment of the present disclosure shown in FIGS. 12 and 13, except for the structure of the first electrode 210, the structure of the light emitting element layer 220, and the structure of the bank 250, no detailed description thereof is given.

The disconnection portion D including an undercut area UC in the light emitting display device according to the fifth embodiment of the present disclosure shown in FIGS. 14 and 15 differs from the structure of the disconnection portion D shown in FIGS. 6 to 7 in that it is positioned only in a partial area of the areas between the subpixels. The disconnection portion D including an undercut area UC in the light emitting display device according to the sixth embodiment of the present disclosure shown in FIGS. 14 and 15 differs from the structure of the disconnection portion D shown in FIGS. 12 and 13 in that it is positioned while surrounding the subpixel.

Referring to FIGS. 14 and 15, there may be included a substrate SUB, a color filter layer CF, an overcoat layer OC, a first electrode 210 (e.g., an anode electrode or a pixel electrode), a bank 250, a light emitting element layer 220 (e.g., an organic light emitting diode), and a second electrode 230 (e.g., a cathode electrode or a common electrode).

For each of a plurality of subpixels SP1, SP2, and SP3, circuit elements including, e.g., capacitors, thin film transistors, and various signal lines may be formed on the substrate SUB. A color filter layer CF may be disposed to correspond to each of the plurality of subpixels SP1, SP2, and SP3.

The overcoat layer OC (or a planarization layer) may be disposed on the color filter layer CF on the substrate SUB. The first electrode 210 (e.g., an anode electrode or a pixel electrode) may be disposed on the overcoat layer OC.

The bank 250 may be disposed on the first electrode 210. The bank 250 may cover an edge portion of the first electrode 210 and define an opening in the subpixel area. The bank 250 may include an opening positioned in a portion of a boundary portion between the subpixel areas. The disconnection portion D may be positioned in the opening of the bank 250 positioned in the boundary portion between the subpixel areas.

The disconnection portion D may be positioned only in boundary portions of some subpixels among the plurality of subpixels SP1, SP2, and SP3.

For example, the disconnection portion D may be positioned to surround the second subpixel SP2. The disconnection portion D may not be positioned in an area adjacent to the first subpixel SP1 or the third subpixel SP3.

The disconnection portion D may be formed by penetrating from the top surface of the bank 250 to the bottom surface of the bank 250. The disconnection portion D may include an undercut area UC formed under a portion of the bank 250 that extends past an end of the first electrode 210. The undercut area UC may be positioned around some subpixels but not other subpixels.

For example, the disconnection portion D positioned to surround the second subpixel SP2 may include the undercut area UC formed by the first electrode 210 and the bank 250 of the second subpixel SP2. The undercut area UC may be disposed to surround the first electrode 210 of the second subpixel SP2.

The first electrode 210 of the first subpixel SP1 may be surrounded by the bank 250. The first electrode 210 of the third subpixel SP3 may be surrounded by the bank 250.

Since the undercut area is positioned around the second subpixel SP2, it is possible to prevent a leakage current from flowing from the second subpixel SP2 to an adjacent subpixel. A leakage current may be prevented from flowing from the adjacent subpixel to the second subpixel SP2.

Since the undercut area is disposed to surround the second subpixel SP2, in a structure in which the second subpixels SP2 are arranged in the same column, leakage current may be prevented from flowing to the adjacent subpixels through the area between the second subpixels SP2.

Alternatively, in a structure in which the second subpixels SP2 and other subpixels are alternately arranged in one column, leakage current may be prevented from flowing in the column direction into the adjacent subpixels. FIGS. 14 and FIG. 15 illustrates an example in which the third subpixel SP3 is positioned on the second subpixel SP2. The leakage current of the second subpixel SP2 may be prevented from flowing into the adjacent subpixel emitting a different color of light.

It is possible to prevent or at least reduce degradation of display quality due to leakage current of a specific subpixel. Since an undercut area UC is not formed in the subpixels around the specific subpixel, it is possible to reduce defects in the process of forming the undercut area UC.

The second subpixel SP2 may be a subpixel emitting a specific color of light. For example, the second subpixel SP2 may be a subpixel emitting red light or blue light. The subpixel representing a different color may be prevented from emitting light due to the leakage current of the subpixel emitting red light or blue light.

In some cases, the undercut area UC may be positioned around the subpixel emitting green light or white light, blocking leakage current flowing into the subpixel emitting green light or white light. However, as in the above-described example, the undercut area UC where the leakage current is blocked may be positioned adjacent to the subpixel emitting red or blue light, increasing the effect of blocking leakage current to the subpixel emitting green light or white light.

Seventh Embodiment

Figure 16:
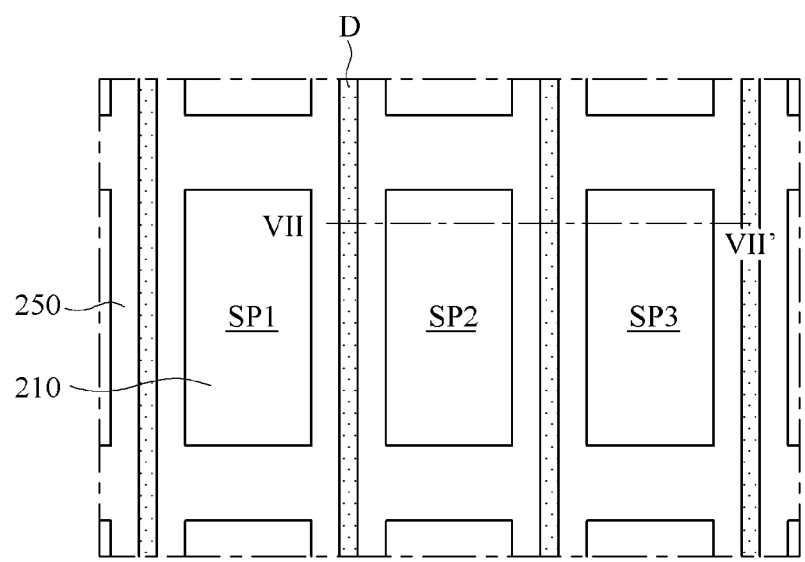
FIG. 16 is a plan view schematically illustrating a first electrode, a bank, and a disconnection portion of subpixels in a light emitting display device according to a seventh embodiment of the present disclosure.
Figure 17:
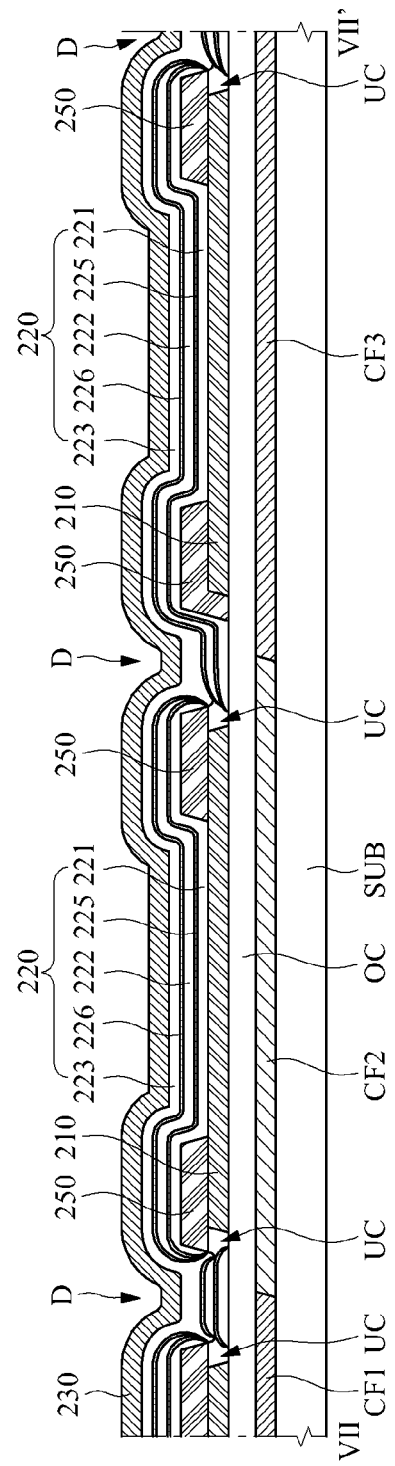
FIG. 17 is a cross-sectional view taken along line VII-VII' of FIG. 16 according to the seventh embodiment of the present disclosure.

FIG. 16 is a plan view schematically illustrating a first electrode, a bank, and a disconnection portion of subpixels in a light emitting display device according to a seventh embodiment of the present disclosure. FIG. 17 is a cross-sectional view taken along line VII-VII' of FIG. 16 according to the seventh embodiment of the present disclosure.

Referring to FIGS. 16 and 17 in conjunction with FIG. 1, a display panel 1100 of a light emitting display according to a seventh embodiment of the present disclosure may be divided into a display area AA and a non-display area NA. The display panel 110 may include a substrate SUB having a plurality of subpixel areas in the display area AA, a first electrode 210, a bank 250, a light emitting element layer 220, a second electrode 230, and a disconnection portion D on the bank 250, disposed on the substrate SUB.

Since the configuration of the light emitting display device according to the seventh embodiment of the present disclosure shown in FIGS. 16 and 17 is substantially the same as the configuration of the light emitting display device according to the second embodiment of the present disclosure shown in FIGS. 5 to 7 or the configuration of the light emitting display device according to the fifth embodiment of the present disclosure shown in FIGS. 12 and 13, except for the structure of the first electrode 210, the structure of the light emitting element layer 220, and the structure of the bank 250, no detailed description thereof is given.

The light emitting display device according to the seventh embodiment illustrated in FIGS. 16 and 17 differs in the structure of the disconnection portion D and undercut area UC shown in FIGS. 5 to 7 or the structure of the disconnection portion D and undercut area UC shown in FIGS. 12 and 13, in that the undercut area UC is not formed in some areas around the plurality of subpixels SP1, SP2, and SP3.

Referring to FIGS. 16 and 17, there may be included a substrate SUB, a color filter layer CF, an overcoat layer OC, a first electrode 210 (e.g., an anode electrode or a pixel electrode), a bank 250, a light emitting element layer 220 (e.g., an organic light emitting diode), and a second electrode 230 (e.g., a cathode electrode or a common electrode).

For each of a plurality of subpixels SP1, SP2, and SP3, circuit elements including, e.g., capacitors, thin film transistors, and various signal lines may be formed on the substrate SUB. A color filter layer CF may be disposed to correspond to each of the plurality of subpixels SP1, SP2, and SP3.

The overcoat layer OC (or a planarization layer) may be disposed on the color filter layer CF on the substrate SUB. The first electrode 210 (e.g., an anode electrode or a pixel electrode) may be disposed on the overcoat layer OC.

The bank 250 may be disposed on the first electrode 210. The bank 250 may cover an edge portion of the first electrode 210 and define an opening in the subpixel area. The bank 250 may include an opening positioned in a boundary portion between the subpixel areas. The disconnection portion D may be positioned in the opening of the bank 250 positioned in the boundary portion between the subpixel areas.

The disconnection portion D may be positioned in each area between the plurality of subpixels SP1, SP2, and SP3.

The disconnection portion D may be formed by penetrating from the top surface of the bank 250 to the bottom surface of the bank 250. The disconnection portion D may include an undercut area UC formed between the first electrode 210 and the bank 250. The disconnection portion D may include a plurality of undercut areas UC adjacent to each of the subpixels positioned on both sides. Alternatively, the disconnection portion D may include only the undercut area UC adjacent to one of the subpixels positioned on both sides. In this case, no undercut area UC may be positioned in an area adjacent to the other one of the subpixels positioned on both sides of the disconnection portion D.

For example, referring to FIG. 17, the disconnection portion D positioned between the first subpixel SP1 and the second subpixel SP2 may include an undercut area UC formed under a first end of the bank 250 that extends past an end of the first electrode 210 of the first subpixel SP1 and an undercut area UC formed by a second end of the bank 250 that extends past an end of the first electrode 210 of the second subpixel SP2.

The disconnection portion D positioned between the second subpixel SP2 and the third subpixel SP3 may include the undercut area UC formed by the first electrode 210 and the bank 250 of the second subpixel SP2. No undercut area UC may be positioned on a side portion of the first electrode 210 of the third subpixel SP3 in the disconnection portion D positioned between the second subpixel SP2 and the third subpixel SP3. The outer surface of the first electrode 210 of the third subpixel SP3 may be surrounded by the bank 250.

Although there is an area in which no undercut area UC is formed in the disconnection portion D, the number of areas in which no undercut area UC is formed in one pixel may be less than the number of areas in which an undercut area UC is formed. It is possible to provide the effect of blocking leakage current by the undercut area UC while reducing defects due to the process of forming the undercut area UC.

In the case of reducing areas with no undercut area UC as shown in FIG. 17, the material (e.g., ITO or IZO) forming the first electrode 210 in the process of forming the first electrode 210 of the plurality of subpixels SP1, SP2, and SP3 may be disposed, separated only in the second subpixel SP2 and the third subpixel SP3. The material forming the first electrode 210 may be disposed in the overall area where the undercut area UC is formed. The material overall forming the first electrode 210 may be removed by etching, forming the undercut area UC.

Since the undercut area UC is not formed only in some areas of the disconnection portion D, the areas where the material forming the first electrode 210 is separated and disposed may be reduced, facilitating the process of disposing the material forming the first electrode 210. It is possible to prevent abnormalities in driving the display due to leakage current by the undercut area UC while reducing defects due to the process of forming the undercut area UC under the bank 250.

The light emitting display device according to various embodiments of the present disclosure may be described as follows.

The light emitting display device according to various embodiments of the present disclosure may comprise a substrate having a plurality of subpixel areas, first electrodes respectively disposed in the plurality of subpixel areas, a bank covering an edge portion of each of the first electrodes and defining an opening of each of the plurality of subpixel areas, a disconnection portion disposed at boundary areas among the plurality of subpixel areas, including an undercut area formed between the first electrode and the bank, a light emitting element layer disposed on the first electrodes, the bank and the disconnection portion, and a second electrode disposed on the light emitting element layer, wherein the light emitting element layer includes at least one light emitting layer disconnected by the undercut area of the disconnection portion.

The light emitting display device according to various embodiments of the present disclosure may further comprise a planarization layer disposed on the plurality of subpixel areas of the substrate, wherein the first electrodes may be disposed on the planarization layer, and the undercut area of the disconnection portion may be disposed among each end of the first electrodes, the planarization layer and the bank.

In the light emitting display device according to various embodiments of the present disclosure, the light emitting element layer may include a first light emitting layer, a charge generation layer disposed on the first light emitting layer, and a second light emitting layer disposed on the charge generation layer, and the first light emitting layer and the charge generation layer of the light emitting element layer may be disconnected by the undercut area of the disconnection portion.

In the light emitting display device according to various embodiments of the present disclosure, the first electrode may be greater than ½ of a sum of thicknesses of the first light emitting layer and the charge generation layer.

In the light emitting display device according to various embodiments of the present disclosure, a width of a gap by the undercut area may be greater than a sum of the thickness of the first light emitting layer and the thickness of the charge generation layer.

In the light emitting display device according to various embodiments of the present disclosure, the first light emitting layer may include a light emitting pattern disposed on the first electrodes and the bank, and a non-light emitting pattern disposed on the disconnection portion and electrically disconnected from the light emitting pattern.

In the light emitting display device according to various embodiments of the present disclosure, the non-light emitting pattern may be formed on the planarization layer on the disconnection portion.

In the light emitting display device according to various embodiments of the present disclosure, the charge generation layer may include a charge generation pattern disposed on the first electrodes and the bank, and a charge non-generation pattern disposed on the disconnection portion and electrically disconnected from the charge generation pattern.

In the light emitting display device according to various embodiments of the present disclosure, the charge non-generation pattern may be formed on the non-light emitting pattern on the disconnection portion.

In the light emitting display device according to various embodiments of the present disclosure, the light emitting element layer may include a plurality of light emitting layers and at least one charge generation layer interposed between the light emitting layers, and at least one of the plurality of light emitting layers and the at least one charge generation layer may be disconnected by the undercut area of the disconnection portion.

In the light emitting display device according to various embodiments of the present disclosure, the first electrode may be greater than ½ of a sum of a thickness of the at least one light emitting layer and a thickness of the at least one charge generation layer.

In the light emitting display device according to various embodiments of the present disclosure, the width of the gap by the undercut area may be greater than the sum of the thickness of the disconnected light emitting layer and the disconnected charge generation layer.

The light emitting display device according to various embodiments of the present disclosure may further comprise a groove formed on the planarization layer disposed in the disconnection portion, wherein the undercut area of the disconnection portion may be disposed among the end of the first electrodes, the groove and the bank.

In the light emitting display device according to various embodiments of the present disclosure, the at least one of the plurality of light emitting layers and the at least one charge generation layer may be disconnected by a step difference of the undercut area of the disconnection portion and the groove.

In the light emitting display device according to various embodiments of the present disclosure, the step difference of the undercut area of the disconnection portion and the groove may be greater than ½ of the sum of the thickness of the at least one light emitting layer and the at least one charge generation layer.

The light emitting display device according to various embodiments of the present disclosure may comprise a substrate having a first subpixel area and a second subpixel area, a planarization layer disposed on the first subpixel area and the second subpixel area of the substrate, first electrodes disposed on the planarization layer on the first subpixel area and the second subpixel area, a first bank disposed on a planarization layer between the first electrodes, a disconnection portion formed between the first electrodes, exposing the planarization layer, a light emitting element layer disposed on the first electrodes, the first bank and the disconnection portion, including a plurality of light emitting layers and at least one charge generation layer interposed between the plurality of light emitting layers, and a second electrode disposed on the light emitting element layer, wherein at least one of the plurality of light emitting layers and the at least one charge generation layer may be disconnected in the disconnection portion, and the disconnected light emitting layer and the disconnected charge generation layer may be disposed on the planarization layer exposed from the disconnection portion.

In the light emitting display device according to various embodiments of the present disclosure, the disconnection portion may include an undercut area disposed among the end of the first electrodes, the planarization layer and the first bank, and at least one of the plurality of light emitting layers and the at least one charge generation layer may be disconnected by the undercut area of the disconnection portion.

The light emitting display device according to various embodiments of the present disclosure may further comprise color filter layers of different colors disposed in each of the first subpixel area and the second subpixel area, wherein the color filter layers may be disposed on the substrate below the planarization layer, and the disconnection portion may be disposed at a boundary area between the first subpixel area and the second subpixel area.

In the light emitting display device according to various embodiments of the present disclosure, a light emitting element layer that is not disconnected due to a bankless structure may be disposed on the first electrodes disposed at a boundary area between the first subpixel area and its adjacent third subpixel area of the same color as that of the first subpixel area.

The light emitting display device according to various embodiments of the present disclosure may further comprise a second bank on the first electrodes disposed at the boundary area between the first subpixel area and its adjacent third subpixel area of the same color as that of the first subpixel area and on the first bank and the disconnection portion, wherein the light emitting element layer which is not disconnected may be disposed on the second bank.

According to various embodiments of the present disclosure, a light emitting display device may comprise a substrate having a first subpixel area and a second subpixel area, first electrodes individually disposed in the first subpixel area and the second subpixel area, a bank covering an edge portion of each of the first electrodes and defining an opening of each of the first subpixel area and the second subpixel area, a disconnection portion disposed in a boundary portion between the first subpixel area and the second subpixel area and including an undercut area formed between the first electrode of the first subpixel area and the bank, an outer surface of the first electrode of the second subpixel area being surrounded by the bank, and a light emitting element layer disposed on the first electrodes, the bank, and the disconnection portion and including at least one light emitting layer disconnected by the undercut area.

In the light emitting display device according to various embodiments of the present disclosure, the at least one light emitting layer may be continuously disposed in a boundary of the bank surrounding the outer surface of the first electrode of the second subpixel area.

In the light emitting display device according to various embodiments of the present disclosure, the light emitting display device may further comprise a planarization layer disposed under the first electrodes. The bank surrounding the outer surface of the first electrode of the second subpixel area may contact an upper surface of the planarization layer.

In the light emitting display device according to various embodiments of the present disclosure, the undercut area formed between the first electrode of the first subpixel area and the bank may be positioned on a side of the first subpixel area facing the boundary portion between the first subpixel area and the second subpixel area.

In the light emitting display device according to various embodiments of the present disclosure, the undercut area may be positioned to surround the edge portion of the first electrode of the first subpixel area.

In the light emitting display device according to various embodiments of the present disclosure, an outer surface of the first electrode of the second subpixel area may be surrounded by the bank on a side of the second subpixel area facing the boundary portion between the first subpixel area and the second subpixel area.

In the light emitting display device according to various embodiments of the present disclosure, the bank may be disposed to surround an outer surface of the first electrode of the second subpixel area.

In the light emitting display device according to various embodiments of the present disclosure, the undercut area formed by the first electrode of the second subpixel area and the bank may be positioned on a side of the second subpixel area facing the boundary portion between the first subpixel area and the second subpixel area.

In the light emitting display device according to various embodiments of the present disclosure, the first subpixel area may be an area emitting red light or blue light, and the second subpixel area may be an area emitting light other than the red light and the blue light.

According to the present disclosure, the following advantageous effects may be obtained.

The light emitting display device according to the present disclosure may prevent a leakage current from occurring between adjacent pixels, thereby preventing deterioration of a color reproduction rate from occurring due to light emission of adjacent pixels, which occurs in a low gray scale.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display device comprising:
a substrate having a plurality of subpixel areas;
a plurality of first electrodes, each of the plurality of first electrodes disposed in a corresponding one of the plurality of subpixel areas;
a bank covering an end of each of the plurality of first electrodes, the bank defining an opening of each of the plurality of subpixel areas;
a disconnection portion disposed at boundary areas between the plurality of subpixel areas;
an undercut area in the disconnection portion, the undercut area formed under an end of the bank that extends past an end of a first electrode from the plurality of first electrodes;
a light emitting element layer including a first portion and a second portion, the first portion electrically connected to the first electrode and disposed on the first electrode, the bank, and the disconnection portion, and the second portion disposed in the disconnection portion but is not electrically connected to the first electrode due to the undercut area; and
a second electrode disposed on the light emitting element layer.

2. The light emitting display device of claim 1, further comprising a planarization layer disposed on the plurality of subpixel areas of the substrate,
wherein the plurality of first electrodes are disposed on the planarization layer, and
a plurality of undercut areas that are each disposed in the disconnection portion at a corresponding one of the boundary areas, each of the plurality of undercut areas formed between the planarization layer and an end of the bank that extends past an end of one of the plurality of first electrodes that is overlapped by the bank and the planarization layer at the boundary area.

3. The light emitting display device of claim 2, wherein the light emitting element layer includes a first light emitting layer, a charge generation layer disposed on the first light emitting layer, and a second light emitting layer disposed on the charge generation layer, and
a portion of the first light emitting layer and a portion of the charge generation layer of the light emitting element layer are included in the second portion of the light emitting element layer that are not electrically connected to the first electrode in the disconnection portion.

4. The light emitting display device of claim 3, wherein a thickness of the first electrode is greater than half of a sum of a thickness of the first light emitting layer and a thickness of the charge generation layer.

5. The light emitting display device of claim 4, wherein a width of the undercut area is greater than a sum of the thickness of the first light emitting layer and the thickness of the charge generation layer.

6. The light emitting display device of claim 3, wherein the second portion of the light emitting element layer is on the planarization layer in the disconnection portion.

7. The light emitting display device of claim 6, wherein the charge generation layer includes:
a charge generation pattern including a first portion disposed on the first electrode and the bank and a second portion in the disconnection portion, the second portion of the charge generation pattern electrically disconnected from the first portion of the charge generation pattern.

8. The light emitting display device of claim 7, wherein the second portion of the charge generation pattern is included in the second portion of the light emitting element layer in the disconnection portion.

9. The light emitting display device of claim 2, wherein the light emitting element layer includes a plurality of light emitting layers and at least one charge generation layer interposed between the plurality of light emitting layers, and
at least one of the plurality of light emitting layers and the at least one charge generation layer includes a first portion that is on the first electrode and a second portion that is in the disconnection portion, the second portion electrically disconnected from the first portion due to the undercut area.

10. The light emitting display device of claim 9, wherein a thickness of the first electrode is greater than half of a sum of a thickness of the at least one light emitting layer and a thickness of the at least one charge generation layer.

11. The light emitting display device of claim 10, wherein a width of the undercut area is greater than the sum of a thickness of the second portion of the at least one of the plurality of light emitting layers and the at least one charge generation layer.

12. The light emitting display device of claim 11, further comprising a groove in a portion of the planarization layer that is in the disconnection portion,
wherein the undercut area is formed between a portion of the groove and the end of the bank that extends past the end of the first electrode.

13. The light emitting display device of claim 12, wherein the second portion of the at least one of the plurality of light emitting layers and the at least one charge generation layer is disconnected from the first portion of the at least one of the plurality of light emitting layers and the at least one charge generation layer by a step difference of the undercut area and the groove.

14. The light emitting display device of claim 13, wherein the step difference of the undercut area and the groove is greater than half of the sum of the thickness of the at least one light emitting layer and the at least one charge generation layer.

15. A light emitting display device comprising:
a substrate having a first subpixel area and a second subpixel area;
a planarization layer disposed on the first subpixel area and the second subpixel area of the substrate;
a first electrode in the first subpixel area, the first electrode on the planarization layer;
a first bank disposed on the first electrode;
a disconnection portion between the first subpixel area and the second subpixel area, a portion of the planarization layer exposed in the disconnection portion;
a light emitting element layer including a first portion and a second portion, the first portion disposed on the first electrode, the first bank, and the disconnection portion, the first portion including a first plurality of light emitting layers and at least one first charge generation layer interposed between the first plurality of first light emitting layers that are electrically connected to the first electrode, and the second portion disposed in the disconnection portion and including a second plurality of light emitting layers and at least one second charge generation layer interposed between the second plurality of light emitting layers that are not electrically connected to the first electrode; and
a second electrode disposed on the light emitting element layer,
wherein the second portion of the light emitting element layer is on the exposed portion of the planarization layer that is in the disconnection portion.

16. The light emitting display device of claim 15, wherein the disconnection portion includes an undercut area formed between a portion of the exposed portion of the planarization layer and an end of the first bank that extends past an end of the first electrode, and
the second portion of the light emitting element layer is not connected to the first portion of the light emitting element layer due to the undercut area in the disconnection portion.

17. The light emitting display device of claim 16, further comprising color filter layers of different colors disposed in each of the first subpixel area and the second subpixel area,
wherein the color filter layers are disposed on the substrate below the planarization layer, and
the disconnection portion is disposed at a boundary area between the first subpixel area and the second subpixel area.

18. The light emitting display device of claim 17, wherein a light emitting element layer that is not disconnected by a bankless structure is disposed on the first electrode disposed at a boundary area between the first subpixel area and a third subpixel area of a same color as that of the first subpixel area.

19. The light emitting display device of claim 18, further comprising a second bank on another first electrode disposed at the boundary area between the first subpixel area and the third subpixel area and on the first bank and the disconnection portion,
wherein the light emitting element layer which is not disconnected is disposed on the second bank.

20. A light emitting display device, comprising:
a substrate having a first subpixel area and a second subpixel area;
a first electrode disposed in the first subpixel area and a first electrode disposed in the second subpixel area;
a bank covering an end of each of the first electrodes, the bank defining an opening of each of the first subpixel area and the second subpixel area;
a disconnection portion disposed at a boundary portion between the first subpixel area and the second subpixel area;
an undercut area in the disconnection portion, the undercut area formed under an end of the bank that extends past an end of the first electrode of the first subpixel area, and an outer surface of the first electrode of the second subpixel area covered by the bank; and
a light emitting element layer disposed on the first electrode of the first subpixel area, the first electrode of the second subpixel area, the bank, and the disconnection portion, the light emitting element layer including a first portion that is electrically connected to the first electrode in the first subpixel area, a second portion that is electrically connected to the first electrode in the second subpixel area, and a third portion in the disconnection portion, wherein the third portion of the light emitting element layer is not electrically connected to the first electrode in the first subpixel area and the first electrode in the second subpixel area due to the undercut area.

21. The light emitting display device of claim 20, wherein the light emitting element layer is continuously disposed in a boundary of the bank surrounding the outer surface of the first electrode of the second subpixel area.

22. The light emitting display device of claim 20, further comprising a planarization layer disposed under the first electrodes of the first subpixel area and the second subpixel area, wherein the bank covering the outer surface of the first electrode of the second subpixel area contacts an upper surface of the planarization layer.

23. The light emitting display device of claim 20, wherein the undercut area is positioned on a side of the first subpixel area facing the boundary portion between the first subpixel area and the second subpixel area.

24. The light emitting display device of claim 20, wherein the undercut area surrounds the end of the first electrode of the first subpixel area.

25. The light emitting display device of claim 20, wherein an outer surface of the first electrode of the second subpixel area is surrounded by the bank on a side of the second subpixel area facing the boundary portion between the first subpixel area and the second subpixel area.

26. The light emitting display device of claim 20, wherein the bank surrounds an outer surface of the first electrode of the second subpixel area.

27. The light emitting display device of claim 20, wherein the undercut area is formed under another end of the bank that extends past the end of the first electrode of the second subpixel area and an end of the first electrode of the second subpixel area, the bank positioned on a side of the second subpixel area facing the boundary portion between the first subpixel area and the second subpixel area.

28. The light emitting display device of claim 20, wherein the first subpixel area is an area emitting red light or blue light, and the second subpixel area is an area emitting light other than the red light and the blue light.

* * * * *